(12) United States Patent
Lee et al.

(10) Patent No.: US 7,667,183 B2
(45) Date of Patent: Feb. 23, 2010

(54) IMAGE SENSOR WITH HIGH FILL FACTOR PIXELS AND METHOD FOR FORMING AN IMAGE SENSOR

(75) Inventors: Seok-ha Lee, Seoul (KR); Duck-hyung Lee, Yongin-si (KR); Jong-cheol Shin, Suwon (KR); Kang-bok Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 179 days.

(21) Appl. No.: 11/593,663

(22) Filed: Nov. 7, 2006

(65) Prior Publication Data

US 2007/0210239 A1 Sep. 13, 2007

Related U.S. Application Data

(63) Continuation-in-part of application No. 11/482,172, filed on Jul. 7, 2006, and a continuation-in-part of application No. 11/481,733, filed on Jul. 7, 2006, now Pat. No. 7,541,628.

(30) Foreign Application Priority Data

Mar. 10, 2006 (KR) .................. 10-2006-0022726

(51) Int. Cl.
*H01L 31/00* (2006.01)
(52) U.S. Cl. .................. 250/214.1; 250/208.1; 257/431; 257/509; 257/510
(58) Field of Classification Search .............. 250/214.1, 250/214 R, 208.1, 226; 257/222, 435, 371, 257/510, 183.1, 184–186, 215, 509, 369, 257/347, 65, 294, 431, 432, 438; 356/616–626
See application file for complete search history.

(56) References Cited

U.S. PATENT DOCUMENTS 4,916,512 A * 4/1990 Ohmi et al. .................. 348/314

(Continued)

FOREIGN PATENT DOCUMENTS

KR 10-2005-0031724 4/2005
KR 10-2005-0038849 4/2005

OTHER PUBLICATIONS

Lee, Seok-ha, et al.,; The Features and Characteristics of 5-Mega CMOS Image Sensor with Topologically Unique 1.7 μm×1.7 μm Pixels; Jun. 13-15, 2006, pp. 142-143; VLSI Technology, 2006. Digest of Technical Papers. 2006 Symposium.

*Primary Examiner*—Thanh X Luu
*Assistant Examiner*—Francis M Legasse, Jr.
(74) *Attorney, Agent, or Firm*—Mills & Onello, LLP

(57) ABSTRACT

An image sensor comprising an array of photoelectric conversion elements in a substrate, the photoelectric conversion elements being arranged in rows and columns extending in a first direction and a second direction respectively, a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column, and a plurality of dielectric isolation regions in the substrate, that each isolate corner portions of neighboring photoelectric conversion elements. In one embodiment, the photoelectric conversion elements have a first pitch in the first direction and have a second pitch in the second direction and the first pitch is substantially equal for the photoelectric conversion elements of a common row, and the second pitch is substantially equal for the photoelectric conversion elements of a common column.

64 Claims, 16 Drawing Sheets

U.S. PATENT DOCUMENTS

| | | |
|---|---|---|
| 5,514,887 A | 5/1996 | Hokari |
| 6,107,655 A | 8/2000 | Guidash ............ 257/233 |
| 6,352,869 B1 | 3/2002 | Guidash ............ 438/16 |
| 6,423,994 B1 | 7/2002 | Guidash ............ 257/292 |
| 6,486,913 B1 | 11/2002 | Afghahi et al. ...... 348/308 |
| 6,545,304 B2 | 4/2003 | Okamoto |
| 6,657,665 B1 | 12/2003 | Guidash ............ 348/308 |
| 6,734,906 B1 | 5/2004 | Hashimoto |
| 2001/0017367 A1* | 8/2001 | Rotstein ............ 256/13.1 |
| 2003/0038336 A1* | 2/2003 | Mann ............... 257/510 |
| 2005/0067637 A1 | 3/2005 | Jang ............... 257/233 |
| 2005/0237405 A1* | 10/2005 | Ohkawa ............ 348/308 |
| 2006/0006485 A1* | 1/2006 | Mouli .............. 257/432 |
| 2006/0223212 A1 | 10/2006 | Jang ............... 438/48 |

* cited by examiner

IMAGE SENSOR WITH HIGH FILL FACTOR PIXELS AND METHOD FOR FORMING AN IMAGE SENSOR

RELATED APPLICATIONS

This application is a continuation-in-part application of U.S. patent application Ser. No. 11/482,172, filed Jul. 7, 2006, and is a continuation-in-part application of U.S. patent application Ser. No. 11/481,733, filed Jul. 7, 2006, now U.S. Pat. No. 7,541,628 the content of each of which is incorporated herein by reference, in its entirety. This application further claims priority under 35 U.S.C. 119 to Korean Patent Application No. 10-2006-0022726 filed on Mar. 10, 2006, the content of which is incorporated herein by reference in its entirety.

BACKGROUND OF THE INVENTION

Semiconductor image sensing devices are widely used for capturing images in a variety of applications such as digital cameras, camcorders, printers, scanners, etc. Such devices include image sensors that capture optical information and convert the optical information into electrical signals, which are then processed, stored, and otherwise manipulated to result in projection of the captured images onto a display or print medium.

There are generally two categories of image sensor devices that are widely used: charge coupled devices (CCD) and CMOS image sensor (CIS) devices. CCD image sensors operate with low noise and with high uniformity, but generally require higher power consumption and lower speed operation than CIS devices. The features of lower power consumption and higher speed capability are important factors when the image sensors are employed in portable electronic devices such as wireless telephones that include an integrated digital camera. In such applications, CIS devices have become the preferred choice over CCD devices.

A CIS device includes an active pixel sensor (APS) array including a two-dimensional array of photoelectric conversion elements, a timing generator that generates a timing signal for reading signals from the APS, a row driver for selecting pixels for reading, a corrected double sampling (CDS) unit for performing a corrected double sampling procedure on the output signals of selected pixels, a comparator for comparing the CDS-corrected signal with a reference signal, an analog-to-digital converter (ADC) for converting analog signals output by the comparator to digital signals, a digital signal processor (DSP) for converting the converted digital signals to digital image signals and an interface unit which receives command signals from the output device and which outputs the digital image signals to the output device. In different configurations, the DSP processor can be integral with the CIS unit or may be provided on a device that is physically separated from the CIS unit.

In contemporary, high-quality CIS devices, each unit pixel of the APS includes a photoelectric conversion element, such as a photodiode or photogate, for collecting the energy of the incident signal, and either three or four readout transistors, depending on the technology type. In a CIS device with four transistors, the readout transistors include a transfer transistor, a select transistor, a drive transistor and a reset transistor. The readout transistors operate to manage and transport the energy received at the photoelectric conversion element to provide corresponding data to the processing devices for image processing. An array of microlenses are formed over the APS pixel array, each microlens corresponding to a pixel of the array, for concentrating the incident energy on the corresponding photoelectric conversion element.

With the continued trend toward further semiconductor device integration, and with the desired increase in resolution of imaging devices, device "fill factor" is of increased importance. The "fill factor" of an imaging device is the proportion of the area of the photoelectric conversion element of a pixel of the device to the total device area designated to the pixel. Greater fill factor is desired, since this equates to more of the available active region of a device being devoted to actual photoelectric conversion of optical signals, and less of the available active region being designated to readout of the signals. Since a CIS device requires three or four readout elements per unit pixel, the CIS device has a lower fill factor than a CCD device. As the resolution of a CIS device is increased, for example from 1 megapixels to 5 megapixels per unit area, the area of a unit pixel in the CIS device should be reduced. However, further reduction of the area required for the three or four readout elements required for each pixel is limited, due to limitations in the minimization of the sizes of the transistor components of the readout elements, since noise increases with smaller element size. Therefore, as CIS device resolution is increased, the device fill factor is generally reduced.

To alleviate the relatively low fill factor in high-resolution CIS devices, a shared-type CIS sensor has been developed. In such shared devices, neighboring photoelectric conversion devices are configured to share one or more of the readout elements. Such a shared configuration is effective for improving the device fill factor; however, this shared configuration also introduces the problem of misalignment between microlenses formed on the devices, and corresponding photoelectric conversion elements. This is because the conventional shared-type CIS sensor can have a different pitch between neighboring photoelectric conversion elements because of the shared readout elements, either in the row direction, in the column direction, or in both the row and column directions. At the same time, because of the manner in which it is fabricated, the microlens array is generally configured to have a constant pitch in both the row and column directions. Thus, misalignment occurs between the microlens array and the pixel array, degrading image quality.

SUMMARY OF THE INVENTION

The present invention is directed to an image sensor that provides the advantages of high-resolution image data with a high fill factor. This is accomplished, in part, by providing an image sensor that has shared-type pixel configuration, with photoelectric conversion elements that are arranged at a constant pitch in the row direction and at a constant pitch in the column direction. In this manner, microlens alignment is achieved, while obtaining a higher fill factor by utilizing the shared-type device configuration.

In one aspect, the present invention is directed to an image sensor comprising: an array of photoelectric conversion elements in a substrate, the photoelectric conversion elements being arranged in rows and columns extending in a first direction and a second direction respectively; a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column; and a plurality of dielectric isolation regions in the substrate, that each isolate corner portions of neighboring photoelectric conversion elements.

In one embodiment, the photoelectric conversion elements have a first pitch in the first direction and have a second pitch in the second direction and wherein the first pitch is substantially equal for the photoelectric conversion elements of a common row, and wherein the second pitch is substantially equal for the photoelectric conversion elements of a common column.

In another embodiment, the image sensor further comprises an array of microlenses formed over the photoelectric conversion elements, the microlenses being arranged in rows and columns, each microlens having a focal point that is aligned with a corresponding photoelectric conversion element, wherein the focal points of the microlenses are arranged to have a first pitch in the first direction and a second pitch in the second direction that are substantially equal to the first pitch of the photoelectric conversion elements, respectively.

In another embodiment, the first pitch is equal to the second pitch.

In another embodiment, the photoelectric conversion elements comprise photoelectric active regions that are formed in the substrate.

In another embodiment, the substrate includes an epitaxial layer and wherein the photoelectric conversion elements comprise photoelectric active regions that are formed in the epitaxial layer.

In another embodiment, the junction isolation regions comprise regions of the substrate that are doped with impurities.

In another embodiment, the dielectric isolation regions comprise portions of a dielectric insulation material that are provided in the substrate.

In another embodiment, the dielectric isolation regions are formed in one of a shallow trench isolation (STI) and a local oxidation of silicon (LOCOS) process.

In another embodiment, the first direction and the second direction comprise a horizontal direction and a vertical direction that are perpendicular to each other.

In another embodiment, at least two neighboring photoelectric conversion elements in at least one of the rows and columns share a common photoelectric active region.

In another embodiment, the neighboring photoelectric conversion elements each comprise a photoelectric active region that is isolated by junction isolation regions at top and bottom portions thereof and at left and right portions thereof, and at dielectric isolation regions at corner portions thereof between the junction isolation regions, one of the dielectric isolation regions being partitioned into two dielectric isolation region segments through which the photoelectric active region is connected to the other neighboring photoelectric element, a first of the two dielectric isolation region segments adjacent a first junction isolation region and a second of the two dielectric isolation region segments adjacent a second junction isolation region, and a connecting portion of the common photoelectric active region extending through the first and second dielectric isolation region segments.

In another embodiment, the image sensor further comprises at least two transfer elements on the active region that operate to separate the common active region of the at least two neighboring photoelectric conversion elements into first and second photoelectric active regions of first and second photoelectric conversion elements.

In another embodiment, two neighboring photoelectric conversion elements of a common row or column each have a corresponding transfer element, and share a common reset element, select element and drive element.

In another embodiment, at least one of the dielectric isolation regions surrounds an isolated active region portion and wherein the select element and drive element are formed at a common isolated active region at a corner portion of one of the photoelectric conversion elements.

In another embodiment, two neighboring photoelectric conversion elements of a common row or column each have a corresponding transfer element and reset element, and share a common select element and drive element.

In another embodiment, at least one of the dielectric isolation regions surrounds an isolated active region and wherein the select element and drive element are formed at a common isolated active region at a corner portion of one of the photoelectric conversion elements.

In another embodiment, four neighboring photoelectric conversion elements of a common row or column each have a corresponding transfer element, and share a common reset element, select element and drive element.

In another embodiment, at least one of the dielectric isolation regions surrounds an isolated active region and wherein the select element and drive element are formed at different isolated active regions at corner portions of one of the photoelectric conversion elements.

In another embodiment, four neighboring photoelectric conversion elements of a common row or column each have a corresponding transfer element and reset element, and share a common select element and drive element.

In another embodiment, at least one of the dielectric isolation regions surrounds an isolated active region and wherein the select element and drive element are formed at different isolated active regions at corner portions of the photoelectric conversion elements.

In another embodiment, four neighboring photoelectric conversion elements of a common row or column each have a corresponding transfer element, and share a common reset element, select element and drive element.

In another embodiment, at least one of the dielectric isolation regions surrounds an isolated active region and wherein the select element and drive element are formed at a common first isolated active region, and wherein the reset element is formed at a second isolated active region that is separated from the first isolated active region, the first and second isolated active regions being positioned at corner portions of corresponding photoelectric conversion elements.

In another embodiment, four neighboring photoelectric conversion elements of two neighboring rows and columns each have a corresponding transfer element, and share a common reset element, select element and drive element.

In another embodiment, at least one of the dielectric isolation regions surrounds an isolated active region and wherein the reset element, select element and drive element are formed at different isolated active regions at corner portions of the photoelectric conversion elements.

In another embodiment, at least one of the dielectric isolation regions surrounds an isolated active region and wherein two of the select element, drive element, and reset element are formed at a common first isolated active region, and wherein the other of the select element, drive element, and reset element is formed at a second isolated active region that is separated from the first isolated active region, the first and second isolated active regions being positioned at corner portions of corresponding photoelectric conversion elements.

In another embodiment, the four neighboring photoelectric elements share a common photoelectric active region.

In another embodiment, the image sensor further comprises an array of microlenses formed over the photoelectric conversion elements, the microlenses being arranged in rows and columns, each microlens having a focal point that is directed at a corresponding photoelectric conversion element.

In another aspect, the present invention is directed to a an image sensing system comprising: a processor connected to a data bus that processes image data signals output by an image sensor; a memory connected to the data bus that stores and retrieves the image data signals output by the image sensor; and an image sensor connected to the data bus that generates the image data signals comprising: an array of photoelectric conversion elements in a substrate, the photoelectric conversion elements being arranged in rows and columns extending in a first direction and a second direction respectively; a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column; and a plurality of dielectric isolation regions in the substrate, that each isolate corner portions of neighboring photoelectric conversion elements, wherein each of the photoelectric conversion elements generates an electric signal in response to photon energy received at the photoelectric conversion element, the image data signals comprising the output signals of multiple photoelectric conversion elements.

In one embodiment, the system further comprises at least one of: a media drive connected to the data bus that stores the image data signals on a medium; an input device connected to the data bus at which control signals are input to the processor for controlling the processing of the image data signals; and a data port connected to the data bus for transferring the image data signals to an external device.

In another embodiment, the photoelectric conversion elements have a first pitch in the first direction and have a second pitch in the second direction and wherein the first pitch is substantially equal for the photoelectric conversion elements of a common row, and wherein the second pitch is substantially equal for the photoelectric conversion elements of a common column.

In another embodiment, the system further comprises an array of microlenses formed over the photoelectric conversion elements, the microlenses being arranged in rows and columns, each microlens having a focal point that is aligned with a corresponding photoelectric conversion element, wherein the focal points of the microlenses are arranged to have a first pitch in the first direction and a second pitch in the second direction that are substantially equal to the first pitch of the photoelectric conversion elements, respectively.

In another embodiment, the first pitch is equal to the second pitch.

In another embodiment, the photoelectric conversion elements comprise photoelectric active regions that are formed in the substrate.

In another embodiment, the substrate includes an epitaxial layer and wherein the photoelectric conversion elements comprise photoelectric active regions that are formed in the epitaxial layer.

In another embodiment, the junction isolation regions comprise regions of the substrate that are doped with impurities.

In another embodiment, the dielectric isolation regions comprise portions of a dielectric insulation material that are provided in the substrate.

In another embodiment, the dielectric isolation regions are formed in one of a shallow trench isolation (STI) and a local oxidation of silicon (LOCOS) process.

In another embodiment, the first direction and the second direction comprise a horizontal direction and a vertical direction that are perpendicular to each other.

In another embodiment, at least two neighboring photoelectric conversion elements in at least one of the rows and columns share a common photoelectric active region.

In another embodiment, the neighboring photoelectric conversion elements each comprise a photoelectric active region that is isolated by junction isolation regions at top and bottom portions thereof and at left and right portions thereof, and at dielectric isolation regions at corner portions thereof between the junction isolation regions, one of the dielectric isolation regions being partitioned into two dielectric isolation region segments through which the photoelectric active region is connected to the other neighboring photoelectric element, a first of the two dielectric isolation region segments adjacent a first junction isolation region and a second of the two dielectric isolation region segments adjacent a second junction isolation region, and a connecting portion of the common photoelectric active region extending through the first and second dielectric isolation region segments.

In another embodiment, at least two transfer elements on the active region that operate to separate the common active region of the at least two neighboring photoelectric conversion elements into first and second photoelectric active regions of first and second photoelectric conversion elements.

In another embodiment, two neighboring photoelectric conversion elements of a common row or column each have a corresponding transfer element, and share a common reset element, select element and drive element.

In another embodiment, at least one of the dielectric isolation regions surrounds an isolated active region portion and wherein the select element and drive element are formed at a common isolated active region at a corner portion of one of the photoelectric conversion elements.

In another embodiment, two neighboring photoelectric conversion elements of a common row or column each have a corresponding transfer element and reset element, and share a common select element and drive element.

In another embodiment, at least one of the dielectric isolation regions surrounds an isolated active region and wherein the select element and drive element are formed at a common isolated active region at a corner portion of one of the photoelectric conversion elements.

In another embodiment, four neighboring photoelectric conversion elements of a common row or column each have a corresponding transfer element, and share a common reset element, select element and drive element.

In another embodiment, at least one of the dielectric isolation regions surrounds an isolated active region and wherein the select element and drive element are formed at different isolated active regions at corner portions of one of the photoelectric conversion elements.

In another embodiment, four neighboring photoelectric conversion elements of a common row or column each have a corresponding transfer element and reset element, and share a common select element and drive element.

In another embodiment, at least one of the dielectric isolation regions surrounds an isolated active region and wherein the select element and drive element are formed at different isolated active regions at corner portions of the photoelectric conversion elements.

In another embodiment, four neighboring photoelectric conversion elements of a common row or column each have a corresponding transfer element, and share a common reset element, select element and drive element.

In another embodiment, at least one of the dielectric isolation regions surrounds an isolated active region and wherein the select element and drive element are formed at a common first isolated active region, and wherein the reset element is formed at a second isolated active region that is separated from the first isolated active region, the first and second isolated active regions being positioned at corner portions of corresponding photoelectric conversion elements.

In another embodiment, four neighboring photoelectric conversion elements of two neighboring rows and columns each have a corresponding transfer element, and share a common reset element, select element and drive element.

In another embodiment, at least one of the dielectric isolation regions surrounds an isolated active region and wherein the reset element, select element and drive element are formed at different isolated active regions at corner portions of the photoelectric conversion elements.

In another embodiment, at least one of the dielectric isolation regions surrounds an isolated active region and wherein two of the select element, drive element, and reset element are formed at a common first isolated active region, and wherein the other of the select element, drive element, and reset element is formed at a second isolated active region that is separated from the first isolated active region, the first and second isolated active regions being positioned at corner portions of corresponding photoelectric conversion elements.

In another embodiment, the four neighboring photoelectric elements share a common photoelectric active region.

In another embodiment, an array of microlenses formed over the photoelectric conversion elements, the microlenses being arranged in rows and columns, each microlens having a focal point that is directed at a corresponding photoelectric conversion element.

In another aspect, the present invention is directed to a method of forming an image sensor comprising: providing an array of photoelectric conversion elements in a substrate, the photoelectric conversion elements being arranged in rows and columns extending in a first direction and a second direction respectively; providing a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column; and providing a plurality of dielectric isolation regions in the substrate, that each isolate corner portions of neighboring photoelectric conversion elements.

In one embodiment, the photoelectric conversion elements have a first pitch in the first direction and have a second pitch in the second direction and wherein the first pitch is substantially equal for the photoelectric conversion elements of a common row, and wherein the second pitch is substantially equal for the photoelectric conversion elements of a common column.

In another embodiment, the method further comprises forming an array of microlenses over the photoelectric conversion elements, the microlenses being arranged in rows and columns, each microlens having a focal point that is aligned with a corresponding photoelectric conversion element, wherein the focal points of the microlenses are arranged to have a first pitch in the first direction and a second pitch in the second direction that are substantially equal to the first pitch of the photoelectric conversion elements, respectively.

In another embodiment, the first pitch is equal to the second pitch.

In another aspect, the present invention is directed to an array of photoelectric conversion elements of an image sensor. The elements are provided in a substrate. Respective photoelectric conversion elements are isolated from neighboring photoelectric conversion elements in a row direction of the array and in a column direction of the array by alternating adjacent junction isolation regions in the substrate and dielectric isolation regions in the substrate.

In one embodiment, the junction isolation regions isolate side portions of the neighboring photoelectric conversion elements, and the dielectric isolation regions isolate corner portions of the neighboring photoelectric conversion elements.

In another embodiment, the photoelectric conversion elements have a first pitch in the row direction and have a second pitch in the column direction, wherein the first pitch is substantially equal for the photoelectric conversion elements of a common row of the array, and wherein the second pitch is substantially equal for the photoelectric conversion elements of a common column of the array.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

In FIG. 3A, the layout of the photoelectric conversion elements of pixels of the APS array circuit, and corresponding isolation regions isolating neighboring pixels, are shown. In FIG. 3B, the layout of the gates of the readout elements corresponding to the pixels are additionally shown.

In FIG. 9A, the layout of the photoelectric conversion elements of pixels of the APS array circuit, and corresponding isolation regions isolating neighboring pixels, are shown. In FIG. 9B, the layout of the gates of the readout elements corresponding to the pixels are additionally shown.

DETAILED DESCRIPTION OF EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Figure 1:
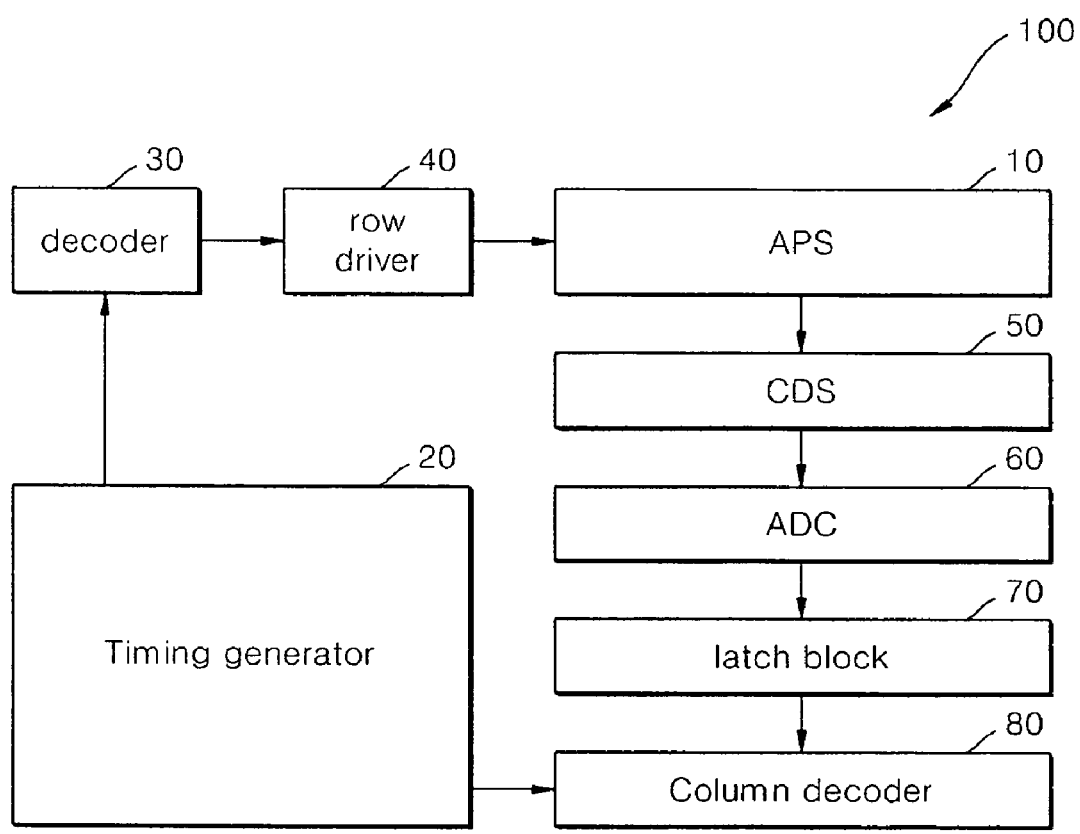
FIG. 1 is a block diagram of a CIS image sensor according to an embodiment of the present invention.

FIG. 1 is a block diagram of a CIS image sensor according to an embodiment of the present invention. Referring to FIG. 1, a CIS image sensor 100 includes an active pixel sensor array (APS) 10, a timing generator 20, a row decoder 30, a row driver 40, a correlated double sampler (CDS) unit 50, an analog to digital converter (ADC) 60, a latch block 70 and a column decoder 80. The APS 10 includes an array of individually addressable pixels, each including a photoelectric conversion element, and a plurality of readout elements. The readout elements include a transfer element, a select element, a driver element, and a reset element. In one embodiment, the photoelectric conversion elements comprise photodiodes or photogates. In other embodiments, the readout elements comprise transistors.

Figure 2:
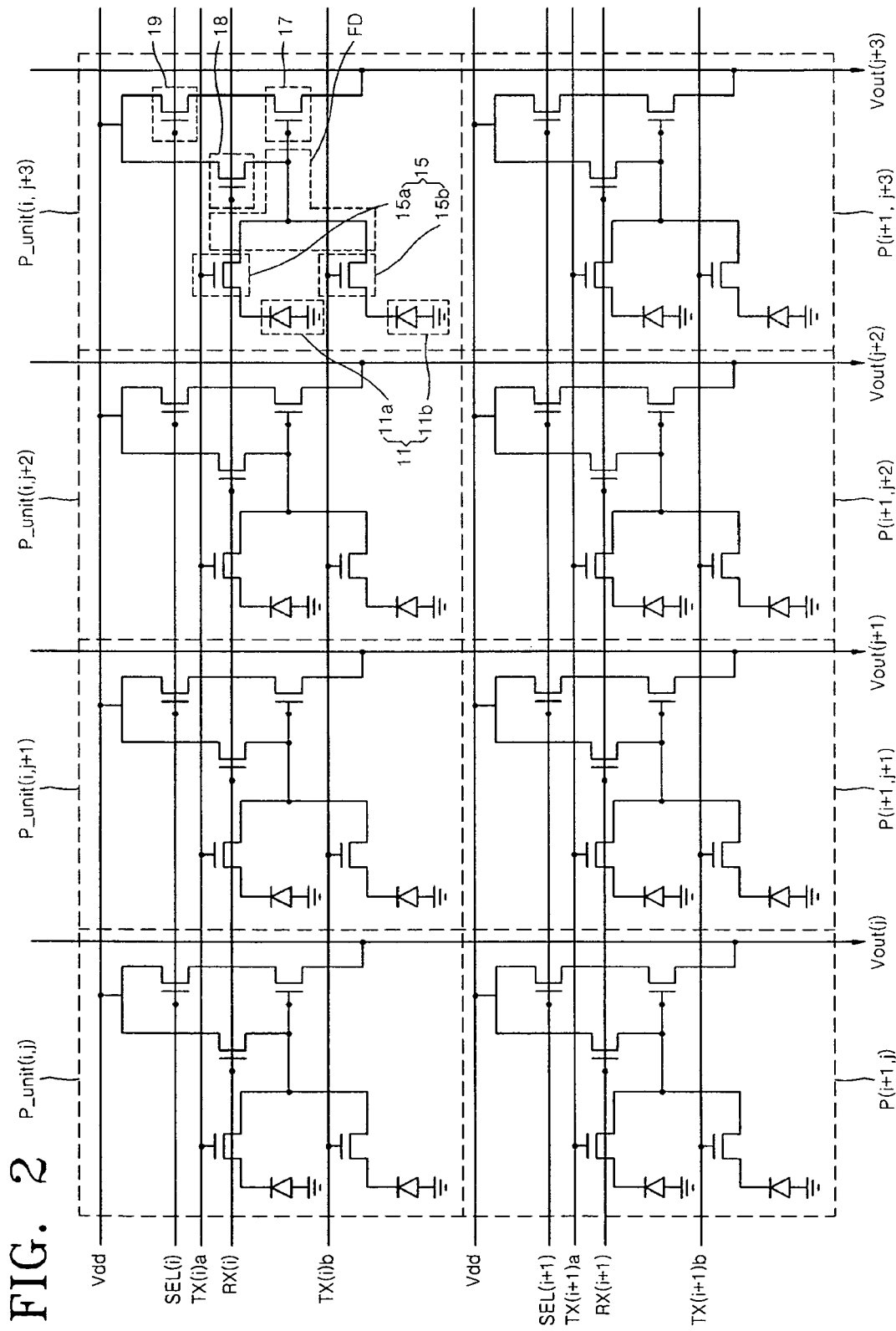
FIG. 2 is a schematic diagram of an APS array circuit of the CIS image sensor of FIG. 1, in accordance with an embodiment of the present invention.

FIG. 2 is a schematic diagram of an APS array circuit of the CIS image sensor of FIG. 1, in accordance with the present invention. In the schematic diagram of FIG. 2, a plurality of unit pixels P_unit (i, j) are arranged in a two-dimensional matrix in row and column directions. Each unit pixel P_unit (i, j) includes first and second photoelectric conversion elements 11a, 11b, and a plurality of readout elements including individual corresponding first and second transfer elements 15a, 15b, and a shared select element 19, drive element 17 and reset element 18. In this configuration, two adjacent photoelectric conversion elements each have a corresponding transfer element, and each two corresponding photoelectric conversion element/transfer element pairs share a common select element 19, drive element 17 and reset element 18. The reset element 18 is connected between a power source Vdd and a floating diffusion region FD coupled to outputs of both transfer elements 15a, 15b, for resetting the floating diffusion region FD. The reset element 18 is activated in response to a reset signal RX(i), and the transfer elements 15a, 15b are activated in response to first and second transfer signals TX(i)a, TX(i)b. The select element 19 and drive element 17 are connected in series between the power source Vdd and the output signal line Vout(j). The select element 19 is activated in response to a select signal SEL(i) and the drive element 17 drives the output signal line Vout(j) in response to the charge stored in the floating diffusion region FD. The transfer elements 15a, 15b are alternately activated to transfer accumulated charge from the corresponding photoelectric conversion element 11a, 11b to the floating diffusion region FD, and, eventually to the output signal line Vout(j). In this manner, the shared-type CIS image sensor obtains a higher fill factor by utilizing the shared-type device configuration. The embodiments of the present invention further improve device imaging accuracy by ensuring alignment between the microlens array and the underlying photoelectric conversion elements, as will be described in further detail below.

Figure 3A:
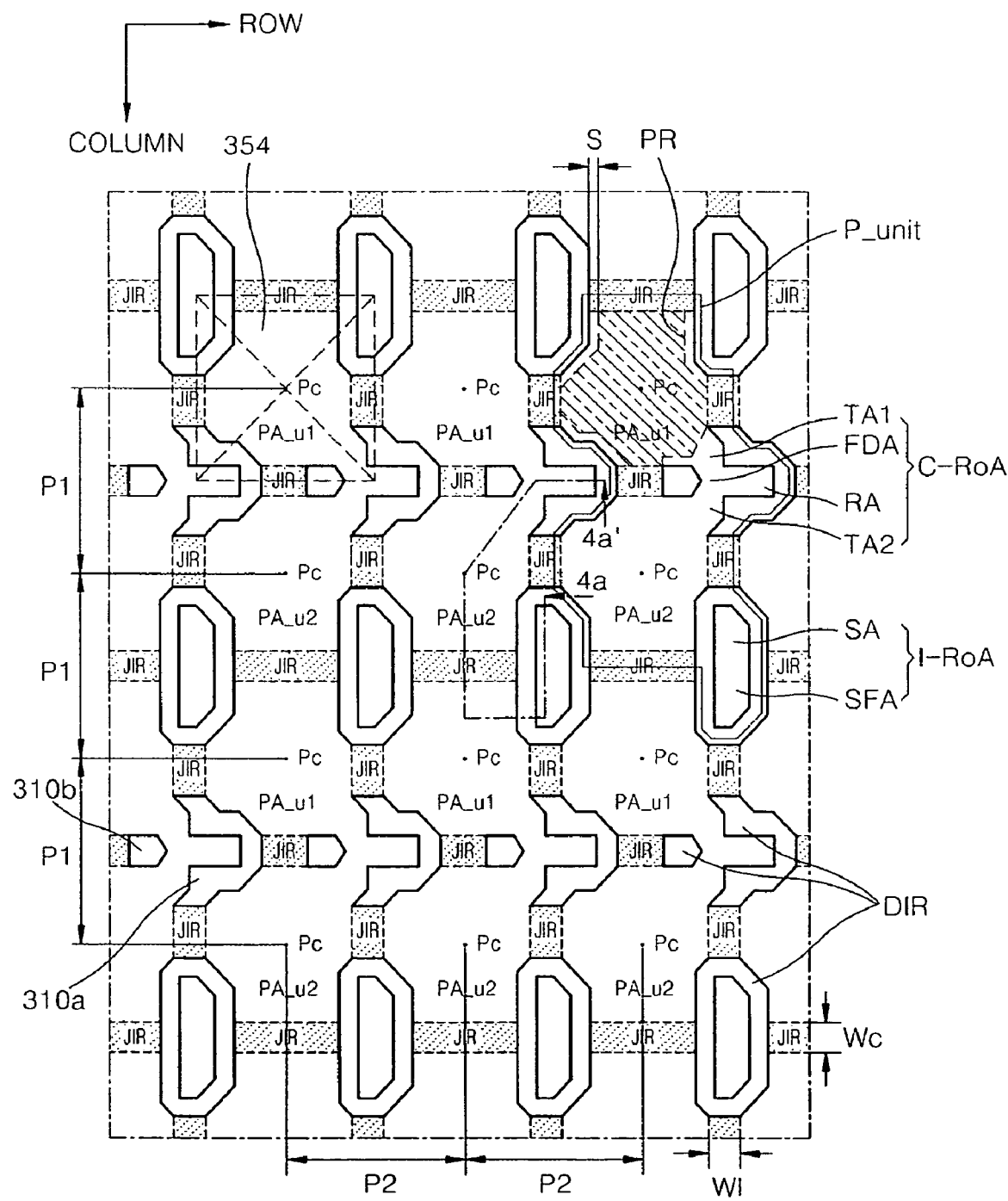
FIGS. 3A and 3B are a top-level layout views of an embodiment of the APS array circuit of FIG. 2, in accordance with an embodiment of the present invention.
Figure 3B:
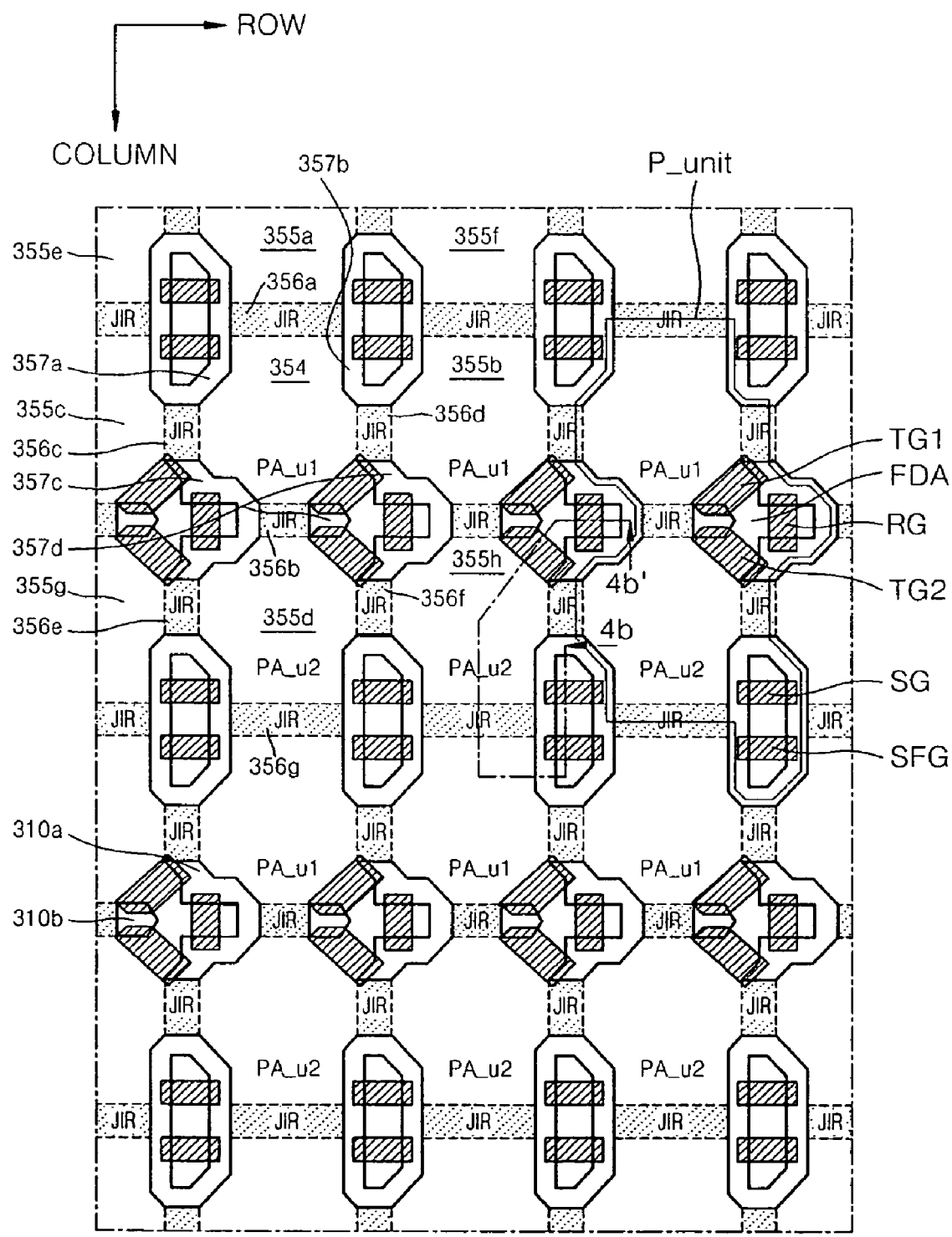

FIGS. 3A and 3B are a top-level layout views of an embodiment of the APS array circuit of FIG. 2, in accordance with the present invention. In FIG. 3A, the layout of the photoelectric conversion elements of pixels of the APS array circuit, and corresponding isolation regions isolating neighboring pixels, are shown. In FIG. 3B, the layout of the gates of the readout elements corresponding to the pixels are additionally shown.

With reference to FIGS. 3A and 3B, in exemplary embodiments of the present invention, alignment of the microlens array and the underlying photoelectric conversion elements is achieved by configuring the device such that the pitch between pixels in the row direction P2 is substantially constant, and such that the pitch between pixels in the column direction P1 is substantially constant. For example, the pitch in the row direction P2 refers to distance between the effective centers Pc of the photoelectric conversion elements in the row direction, and the pitch in the column direction P1 refers to distance between the effective centers Pc of the photoelectric conversion elements in the column direction. Maintaining a constant pitch P1, P2 in each of the column and row directions ensures that a corresponding microlens array having a corresponding periodicity between lenses in the column and row directions can be readily provided, while ensuring accurate alignment of the microlens array and the underlying array of photoelectric conversion elements. While a constant pitch P2 in the row direction and a constant pitch P1 in the column direction is desired in the embodiments of the present invention, it is not necessary that the pitch P2 in the row direction be equal to the pitch P1 in the column direction; however, such an equal pitch P1=P2 would be preferred in certain applications where horizontal-to-vertical image symmetry is desired.

Referring to FIGS. 3A and 3B, a two-dimensional APS pixel array is arranged in row and column directions. Each pixel includes a photoelectric conversion element. Neighboring photodiodes in the row direction are electrically isolated from each other. The centers of neighboring photodiodes in the row direction have a constant pitch P2. Pairs of neighboring photoelectric conversion elements 11a, 11b in the column direction share a common connected readout active region C-RoA. Neighboring pairs of neighboring photodiodes in the column direction are electrically isolated from each other. The centers of neighboring photodiodes in the column direction have a constant pitch P1, including both neighboring photodiodes sharing a common connected readout active region C-RoA, and neighboring photodiodes that are electrically isolated from each other.

In the example embodiment of FIGS. 3A and 3B, a first pixel comprises a first photoelectric conversion element active region PA_u1 and a second pixel, neighboring the first pixel in the column direction comprises a second photoelectric conversion element active region PA_u2. Together, the first photoelectric conversion element PA_u1 and the second photoelectric conversion element PA_u2 comprise a pixel unit P_unit, for example, corresponding to the pixel unit P_unit (i, j) of FIG. 2. The pixel unit P_unit includes the first photoelectric conversion element PA_u1, the second photoelectric conversion element PA_u2, a connected readout active region C-RoA and an isolated readout active region I-RoA. The readout elements that are used for reading the charge that is accumulated at the photoelectric conversion elements PA_u1, PA_u2 are positioned in the connected readout active region C-RoA and the isolated readout active region I-RoA.

The first and second photoelectric conversion elements PA_u1, PA_u2 of a common pixel unit P_unit are connected at the connected readout active region C-RoA. In the connected readout active region C-RoA, a first transfer gate TG1 on the first transfer element active region TA1 and a second transfer gate TG2 on the second transfer element active region TA2 of the first and second transfer elements 15a, 15b respectively control the flow of charge between the first and second photoelectric conversion elements PA_u1, PA_u2 respectively, and a common floating diffusion region FDA. A shared reset gate RG of the reset element 18 on the reset element active region RA controls the flow of charge between the power source Vdd and the common floating diffusion region FDA, for resetting the common floating diffusion region FDA.

In the isolated readout active region I-RoA the select element 19 and drive element 17 that are shared by the common pixel unit P_unit are located. The drive element 17 is also referred to as a source follower element. A shared select gate SG on the select element active region SA of the select element 19 and a shared drive gate SFG on the drive element active region SFA of the drive element 17 are located on the isolated readout active region I-RoA.

The first and second photoelectric conversion elements PA_u1, PA_u2 of a common pixel unit P_unit are isolated from neighboring photoelectric conversion elements of neighboring pixel units by two forms of isolation, namely, dielectric isolation regions (DIR) and junction isolation regions (JIR). Examples of DIR isolation include shallow trench isolation (STI) and local oxidation of silicon (LOCOS). In such DIR isolation techniques, insulation material, such as an oxide-containing material, is provided in a trench formed in the device substrate to a certain depth, in order to ensure isolation between adjacent device elements. In JIR isolation, regions of the substrate are doped with P or N doping substances to an intensity and depth so as to ensure isolation between adjacent device elements. For example, in a JIR isolation region, a CIS photoelectric conversion element, for example, usually includes an n-type photodiode in the device substrate that is formed to a certain depth and a p-type region is formed on the n-type photodiode. Neighboring n-type photodiodes of the neighboring photoelectric conversion elements require isolation from each other; thus, a P-type dopant such as boron or $BF_2$ can be implanted to a sufficient depth for covering the n-type photodiode to provide a JIR isolation region.

DIR isolation is advantageous in that it is an effective isolation solution for the various readout elements including, in this example, the first and second transfer elements 15a, 15b and the shared reset element 18, select element 19 and drive element 17. However, DIR isolation requires formation of a trench having a width that is difficult to reduce using contemporary fabrication techniques. In addition, at the interface of the trench of a DIR isolation structure, substrate defects are present, which can lead to the generation of dark current due to thermal energy. Accordingly, it is common to form a DIR isolation structure to include a buffer region of an impurity well to surround the trench of the DIR isolation structure, to ensure that dark current that is generated in the substrate defects of the trench does not propagate beyond the DIR isolation structure. Such a buffer region is indicated by reference element S of FIG. 3A.

For this reason, JIR isolation is advantageous for isolating neighboring photoelectric conversion elements, since the isolation region can be formed to have a width that is relatively less than a comparative width of the trench of a DIR isolation structure. In addition, JIR isolation structures are not a source for substrate defects, and therefore, such JIR isolation structures are less conducive to the generation of dark current, as compared to DIR isolation structures. Therefore a buffer region S that is required at the sides of the DIR isolation structures is not required for the JIR isolation structures, leading to an increased surface area for the photoelectric conversion elements and therefore a greater fill factor for the resulting device. The JIR structures extending in the row direction, for example, JIR structures 356a, 356b, and 356g of FIG. 3b, have a width Wc that can be defined by the design rule of the fabrication process. Similarly, the JIR structures extending in the column direction, for example, JIR structures 356c, 356d, 356e, and 356f, have a width W1 that can be defined by the design rule of the fabrication process. In certain embodiments, W1 can equal Wc; however, this is optional and not required.

Referring to FIGS. 3A and 3B, it can be seen that in the present exemplary configuration of the present embodiment, the photoelectric conversion elements PA_u1, PA_u2 are arranged in rows and columns extending in a first direction and a second direction, respectively, of a substrate.

A plurality of first junction isolation regions JIR 356a, 356b, 356g are formed in the substrate that each isolate side portions of neighboring photoelectric conversion elements PA_u1, PA_u1 of a common row, and a plurality of second junction isolation regions JIR 356c, 356d, 356e, 356f are formed in the substrate that each isolate side portions of neighboring photoelectric conversion elements PA_u1, PA_u2 of a common column. For example, with reference to FIG. 3b, in the array configuration shown, photoelectric conversion element 354 neighbors photoelectric conversion element 355a at a top side portion thereof, and neighbors photoelectric conversion element 355d at a bottom side portion thereof, in the column direction. The JIR structure 356a isolates photoelectric conversion element 354 at the top side portion thereof from the neighboring photoelectric conversion element 355a and the JIR structure 356b isolates photoelectric conversion element 354 at the bottom side portion thereof from the neighboring photoelectric conversion element 355d. The same photoelectric conversion element 354 neighbors photoelectric conversion element 355c at a left side portion thereof and neighbors photoelectric conversion element 355d at a right side portion thereof, in the row direction. The JIR structure 356c isolates photoelectric conversion element 354 at the left side portion thereof from the neighboring photoelectric conversion element 355c and the JIR structure 356d isolates photoelectric conversion element 354 at the right side portion thereof from the neighboring photoelectric conversion element 355b.

A plurality of dielectric isolation regions DIR are also provided in the substrate, each isolating corner portions of the neighboring photoelectric conversion elements. For example, with reference to FIG. 3b, in the array configuration shown, photoelectric conversion element 354 neighbors photoelectric conversion elements 355c, 355e and 355a at a top left corner thereof. The DIR structure 357a isolates photoelectric conversion element 354 at the top left corner thereof from the neighboring photoelectric conversion elements 355c, 355e and 355a. Similarly, photoelectric conversion element 354 neighbors photoelectric conversion elements 355a, 355f and 355b at a top right corner thereof. The DIR structure 357b isolates photoelectric conversion element 354 at the top right corner thereof from the neighboring photoelectric conversion elements 355a, 355f and 355b. Also, photoelectric conversion element 354 neighbors photoelectric conversion elements 355b, 355h and 355d at a bottom right corner thereof. The DIR structure 357d isolates photoelectric conversion element 354 at the bottom right corner thereof from the neighboring photoelectric conversion elements 355b, 355h and 355d. In addition, photoelectric conversion element 354 neighbors photoelectric conversion elements 355c, 355g and 355d at a bottom left corner thereof. The DIR structure 357c isolates photoelectric conversion element 354 at the bottom left corner thereof from the neighboring photoelectric conversion elements 355c, 355g and 355d.

In this embodiment, the JIR structures 356a, 356c, 356b and 356d each extend between, and are adjacent to, two DIR structures 357a, 357c, 357d and 357b. For example, JIR structure 356a extends between DIR structures 357a and 357b, JIR structure 356c extends between DIR structures 357a and 357c, and so forth, to form a continuous isolation structure about each photoelectric conversion element 354. In this manner together, the JIR structures 356a, 356c, 356b, 356d and the DIR structures 357a, 357c, 357d, 357b are adjacent to each other and therefore surround and isolate the corresponding photoelectric conversion element 354 from neighboring photoelectric conversion elements 355a-355h. The JIR structures 356a, 356b, 356c, 356d isolate side portions of the photoelectric conversion element 354 from neighboring photoelectric conversion elements 355a, 355b, 355c, 355d in the row and column direction. The DIR structures 357a, 357b, 357c, 357d isolate top left, top right, lower left, and lower right corner portions of the photoelectric conversion element 354 from neighboring photoelectric conversion elements 355e, 355f, 355g, 355h positioned diagonally in the array relative to the element 354, and also partially isolate the photoelectric conversion element 354 from neighboring photoelectric conversion elements 355a, 355b, 355c, 355d positioned at sides of the element 354, in combination with the JIR structures 356a, 356d, 356b, 356c extending between the DIR structures.

In the configuration shown, the photoelectric conversion elements PA_u1, PA_u2 have a first pitch P2 in the first, row, direction and have a second pitch P1 in the second, column, direction. The first pitch P2 is substantially constant, or substantially equal for the photoelectric conversion elements PA_u1, PA_u1 of a common row, and the second pitch P1 is substantially constant, or substantially equal for the photoelectric conversion elements PA_u1, PA_u2 of a common column. The geometries of the photoelectric conversion elements 354, the DIR isolation structures, and the JIR isolation structures are selected so as to ensure that the first pitch P2 is substantially constant, and so that the second pitch P1 is substantially constant.

Some of the DIR isolation structures, for example, DIR structure 357d, are in the corner regions of the photoelectric conversion elements PA_u1, PA_u2, but allow active regions of neighboring photoelectric conversion elements, for example, photoelectric conversion elements 344 and 355d to be connected and thereby share a common floating diffusion region FDA. For example some of the DIR structures include first and second segments 310a, 310b that are spaced apart at a location where a connecting portion of the photoelectric conversion element connects active regions PA_u1, PA_u2. In these connecting portions, the flow of charge between the photoelectric conversion element and the FD region is controlled by a respective transfer gate TG that is associated with the photoelectric conversion element. In this sense, the neighboring photoelectric conversion elements are not truly isolated by a DIR isolation structure or a JIR isolation structure in this region. A first segment 310a of the DIR structure 357d extends between neighboring JIR isolation structures in the column direction, and a second segment 310b of the DIR structure extends from a neighboring JIR isolation structure in the row direction, and is spaced apart from the first segment 310a.

Figure 4A:
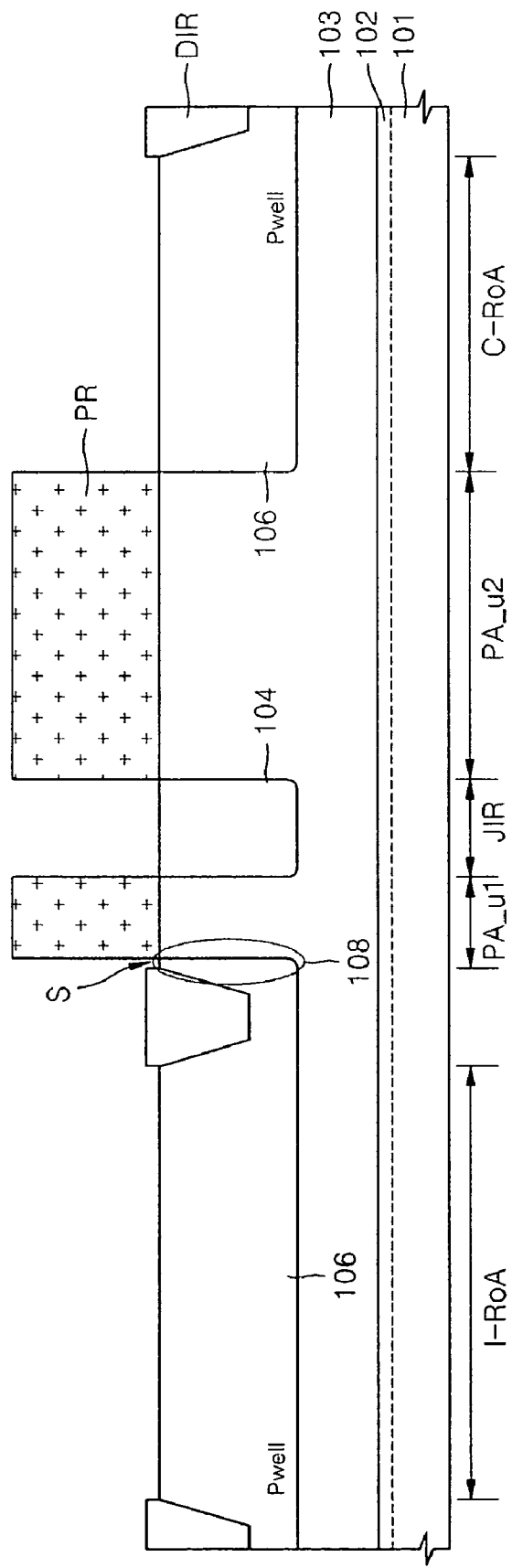
FIGS. 4A and 4B are sectional views of the APS array circuit of FIG. 2, taken along section line 4a-4a' of FIG. 3A and taken along section line 4b-4b' of FIG. 3B, respectively, illustrating a method of forming an imaging device, in accordance with an embodiment of the present invention.
Figure 4B:
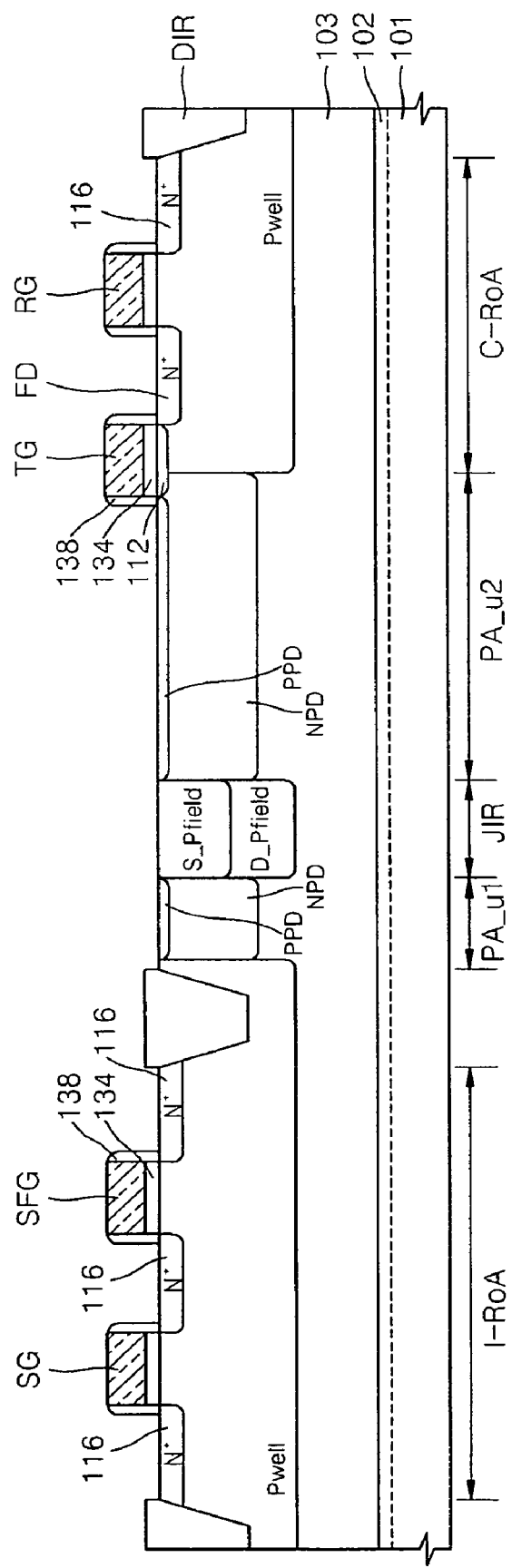

FIGS. 4A and 4B are sectional views of the APS array circuit of FIG. 2, taken along section line 4a-4a' of FIG. 3A and taken along section line 4b-4b' of FIG. 3B, respectively, illustrating a method of forming an imaging device in accordance with an embodiment of the present invention.

With reference to FIG. 4A, it can be seen that a potential barrier layer 102 is provided on a semiconductor substrate 101. In one example, the substrate 101 comprises a P-type substrate for lowering the effects of dark current. The potential barrier layer 102 operates to prohibit dark current injection into the photoelectric conversion element formed on or in the substrate 101. As used herein, the term "substrate" refers to any of a number of substrate types, including, but not limited to a bulk semiconductor substrate, a silicon-on-insulator (SOI) structure, or an epitaxial layer, for example a single-crystal layer, that is grown on a bulk substrate. In this example, an epitaxial layer 103 is formed on the substrate 101. A single-crystal epitaxial layer is desired for formation of the active region of the photoelectric conversion elements, since heightened crystal purity leads to more efficient photoelectric conversion.

Isolation structures of the DIR type are next formed on the substrate according to conventional formation techniques, including STI and LOCOS techniques. A photoresist layer PR is then formed and patterned to cover the regions where the photoelectric conversion elements are to be formed, and to expose regions where the DIR and JIR isolation regions are to be formed. It can be seen in this example that the photoresist pattern PR is formed to expose a channel stop region 108 of width S adjacent to the DIR to eliminate the flow of dark current that may be generated in the DIR isolation regions.

Impurities are then doped into the epitaxial layer 103 to form P-well regions 106, 107 in the connected readout active region C-RoA and isolated readout active region I-RoA respectively. At the same time, the P-well regions 106, 107 are formed to include a channel stop region 108 of width S that surrounds the DIR isolation structures. Also, a field region 104 is formed in the epitaxial layer to provide the JIR isolation structure. In one embodiment, the impurities comprise P-type dopants. The doping is optionally performed in two steps including a high-energy doping and a low-energy doping using two or more doping procedures.

With reference to FIG. 4B, channel regions 112 are optionally formed on the surface of the epitaxial layer 103 for the transfer gates TG of the transfer elements to be subsequently formed. Gates for the transfer gates TG of the transfer elements 15a, 15b, the reset gate RG of the reset element 18, the select gate SG of the select element 19 and the source follower gate SFG of the drive element 17 are then formed and patterned according to conventional fabrication techniques. The gates each include a gate oxide pattern 134 and a gate electrode TG, RG, SG, SFG.

NPD and PPD regions of the photoelectric conversion elements PA_u1, PA_u2 are next formed by doping the photodiode regions with N-type impurities and P-type impurities respectively. The NPD regions are formed, for example, at a doping concentration ranging between about 1E15 and 1E18, and the PPD regions are formed, for example, at a doping concentration ranging between about 1E17 and 1E20. A P-type region PPD is desired at the surface of the epitaxial layer 103 to reduce the effects of dark current in the photodiode region.

Sidewall spacers 138 are formed at sidewalls of the gates TG, RG, SG, SFG according to conventional techniques. A floating diffusion region FD and source/drain regions 116 are then formed by implanting N-type dopants at appropriate concentrations.

Figure 5:
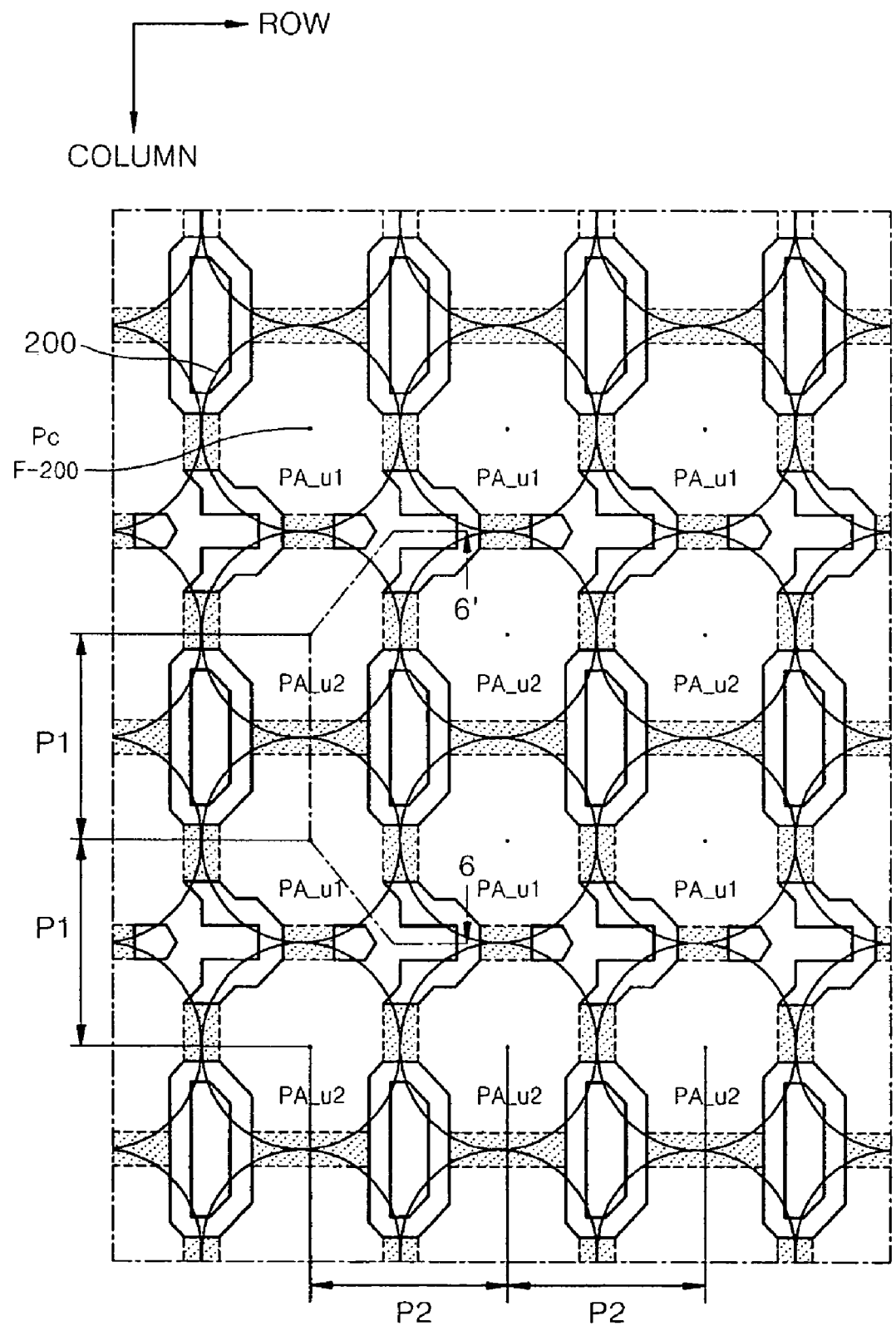
FIG. 5 is a top-level layout view of an embodiment of the APS array circuit of FIG. 2, illustrating the positioning of a microlens array formed on the pixel array, relative to the positioning of the pixels, in accordance with an embodiment of the present invention.
Figure 6:
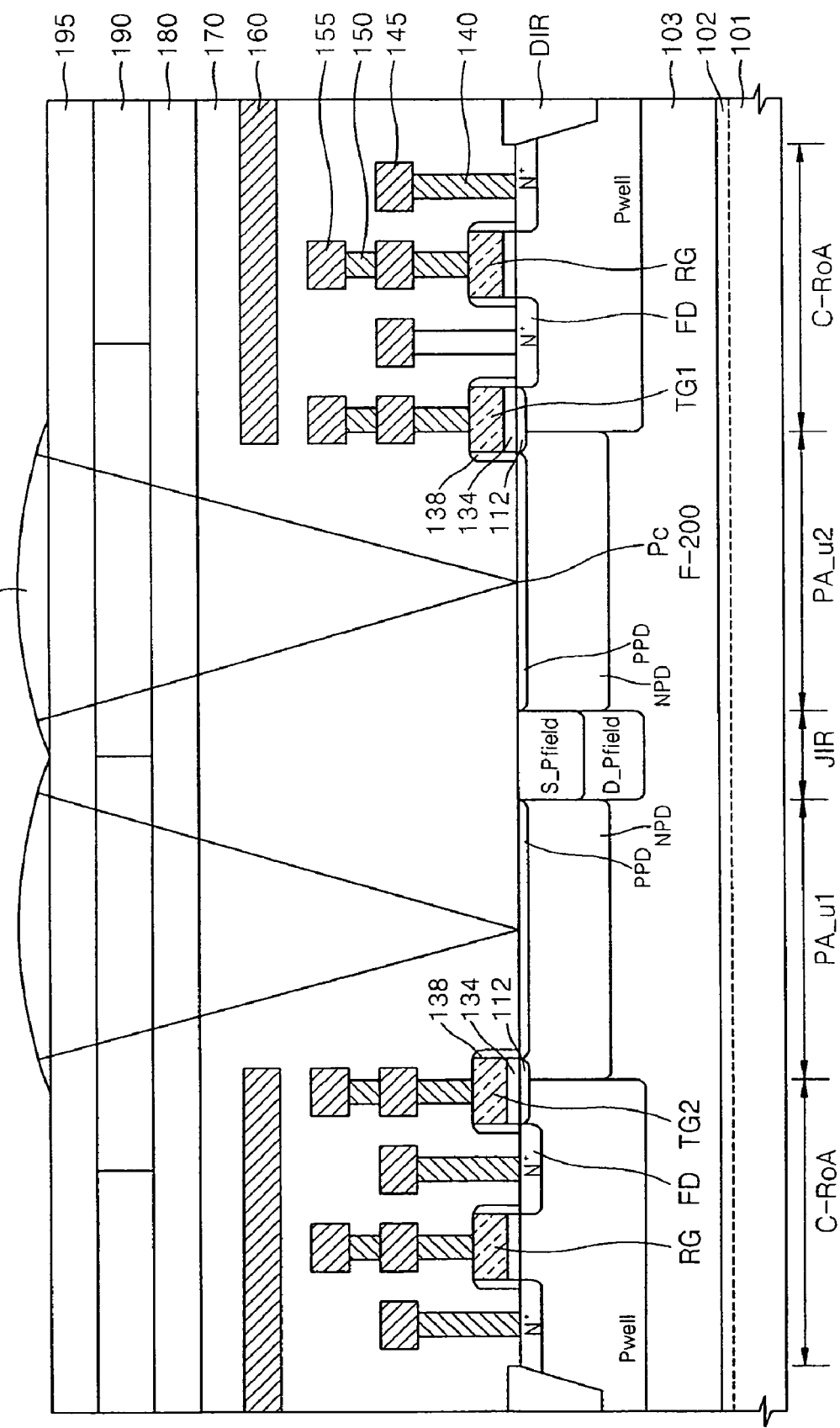
FIG. 6 is a sectional view of the APS array circuit of FIG. 5, taken along section line 6-6' of FIG. 5, in accordance with an embodiment of the present invention.

FIG. 5 is a top-level layout view of an embodiment of the APS array circuit of FIG. 2, illustrating the positioning of a microlens array formed on the pixel array, relative to the positioning of the pixels, in accordance with an embodiment of the present invention. FIG. 6 is a sectional view of the APS array circuit of FIG. 5, taken along section line 6-6' of FIG. 5, in accordance with an embodiment of the present invention.

With reference to FIG. 5, it can be seen that a microlens array 200 is formed over the pixel array, the microlens array 200 having a pitch P2 that is constant in the row direction and having a pitch P1 that is constant in the column direction. The pitch P2 in the row direction and the pitch P1 in the column direction are selected such that the distance between focuses F-200 of adjacent microlenses 200 in the row direction is equal to the pitch P2 in the row direction between neighboring photoelectric conversion elements of the pixel array and such that the distance between focuses of adjacent microlenses in the column direction is equal to the pitch P1 in the column direction between neighboring photoelectric conversion elements of the pixel array. In this manner, each pixel of the array has a corresponding microlens 200, the focus F-200 of which is in substantial alignment with the center of the photoelectric conversion element PA_u1, PA_u2 of the pixel.

With reference to FIG. 6, following the fabrication procedures of FIG. 4, a multiple-layered interlayer dielectric layer 170 is provided, including a plurality of horizontal interconnections 145, 155 and vertical plugs 140, 150 which provide electrical interconnection between various components of the device. A shield layer 160 is also provided in the interlayer dielectric 170 to prevent incident light energy from impacting operation of the readout elements. A lower flattening layer 180, an array of color filters 190 and an upper flattening layer 195 are provided on the interlayer dielectric 170 according to conventional techniques. Microlenses 200 are formed on the upper flattening layer, each microlens configured to have a focus F-200 that is in alignment with the effective center, such as the geometric center Pc, of the corresponding photoelectric conversion element.

Figure 7:
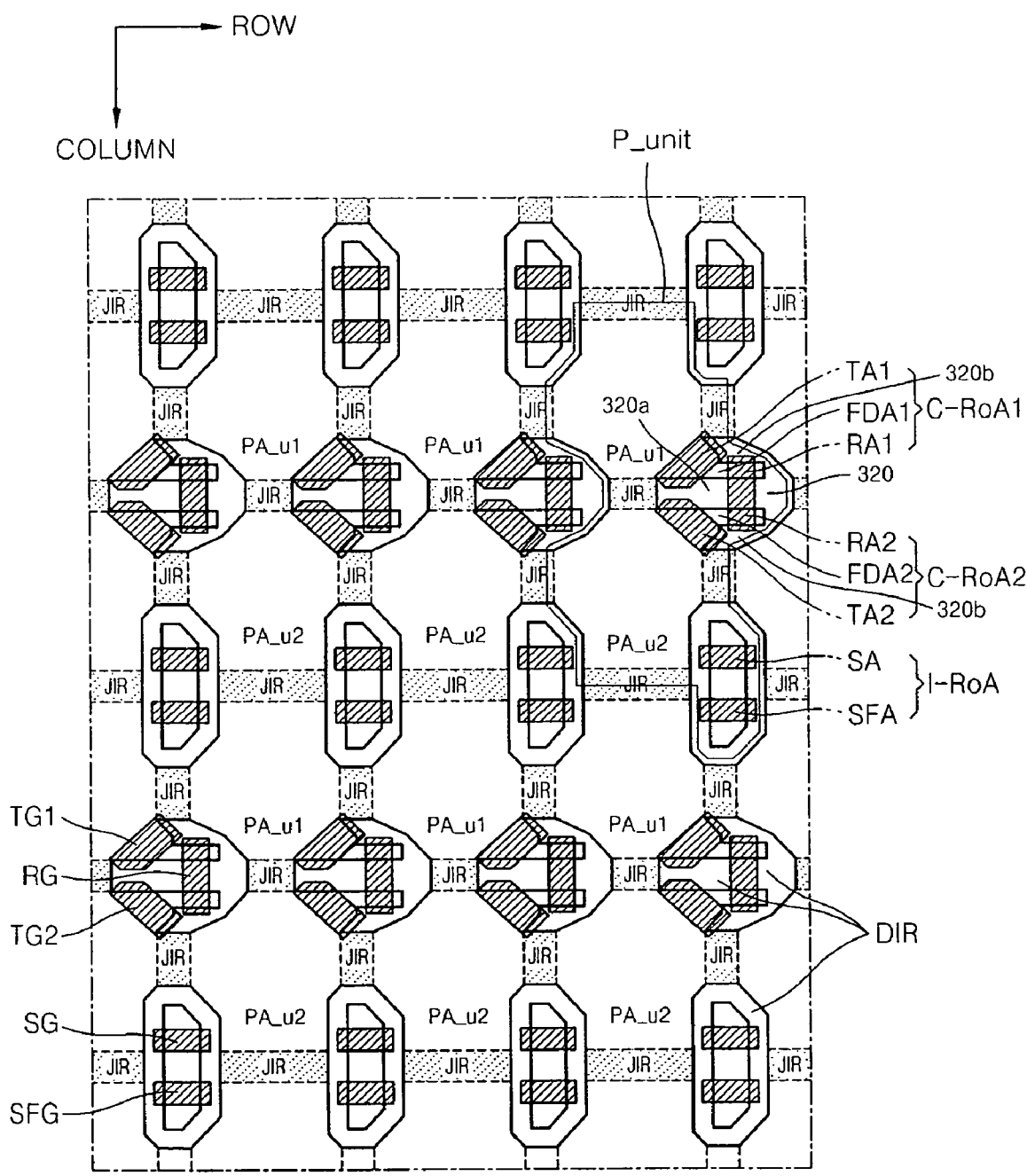
FIG. 7 is a top-level layout view of another embodiment of the APS array circuit of FIG. 2, including the layout of the photoelectric conversion elements of pixels of the APS array circuit, and corresponding isolation regions isolating neighboring pixels, along with the layout of the gates of the readout elements corresponding to the pixels, in accordance with the present invention.

FIG. 7 is a top-level layout view of another embodiment of the APS array circuit of FIG. 2, including the layout of the photoelectric conversion elements of pixels of the APS array circuit, and corresponding isolation regions isolating neighboring pixels, along with the layout of the gates of the readout elements corresponding to the pixels, in accordance with the present invention. This embodiment shares many similarities with the embodiment of FIGS. 3A and 3B above. These similarities are not repeated in the description of the present embodiment. A difference in the present embodiment lies in that the active layer of the first photoelectric conversion element PA_u1 and the active layer of the second photoelectric conversion element PA_u2 are not electrically connected at a common floating diffusion region FD as in the embodiment depicted in FIGS. 3A and 3B. Instead, in the present embodiment, the active layers of the first and second photoelectric conversion elements of each pixel unit P_unit are isolated by a DIR isolation structure. For example, a bottom, right corner portion of the first photoelectric conversion element PA_u1 and a top, right corner portion of the second photoelectric conversion element PA_u2 are electrically isolated by the DIR isolation structure 320. In this example, the DIR isolation structure 320 includes a body portion 320a that extends in the row direction between neighboring JIR isolation regions, and further includes first and second wing portions 320b that each extend in the column direction between neighboring JIR isolation regions.

In the example embodiment of FIG. 7, a first connected readout active region C-RoA1 is connected to the active region of the first photoelectric conversion element PA_u1 and a second connected readout active region C-RoA2 is connected to the active region of the second photoelectric conversion element PA_u2. In the first connected readout active region C-RoA1, a first transfer gate TA1 of a first transfer element and a first reset gate RA1 of a first reset element are located at opposite sides of a first floating diffusion region FDA1. In the second connected readout active region C-RoA2, a second transfer gate TA2 of a second transfer element and a second reset gate RA2 of a second reset element are located at opposite sides of a second floating diffusion region FDA2. Like the embodiment of FIGS. 3A and 3B above, a shared select gate SA of a select element and a shared drive gate SFA of a drive element are located in the isolated readout active region I-RoA. This embodiment offers many of the same advantages as those described above in connection with the previous embodiments.

Figure 8:
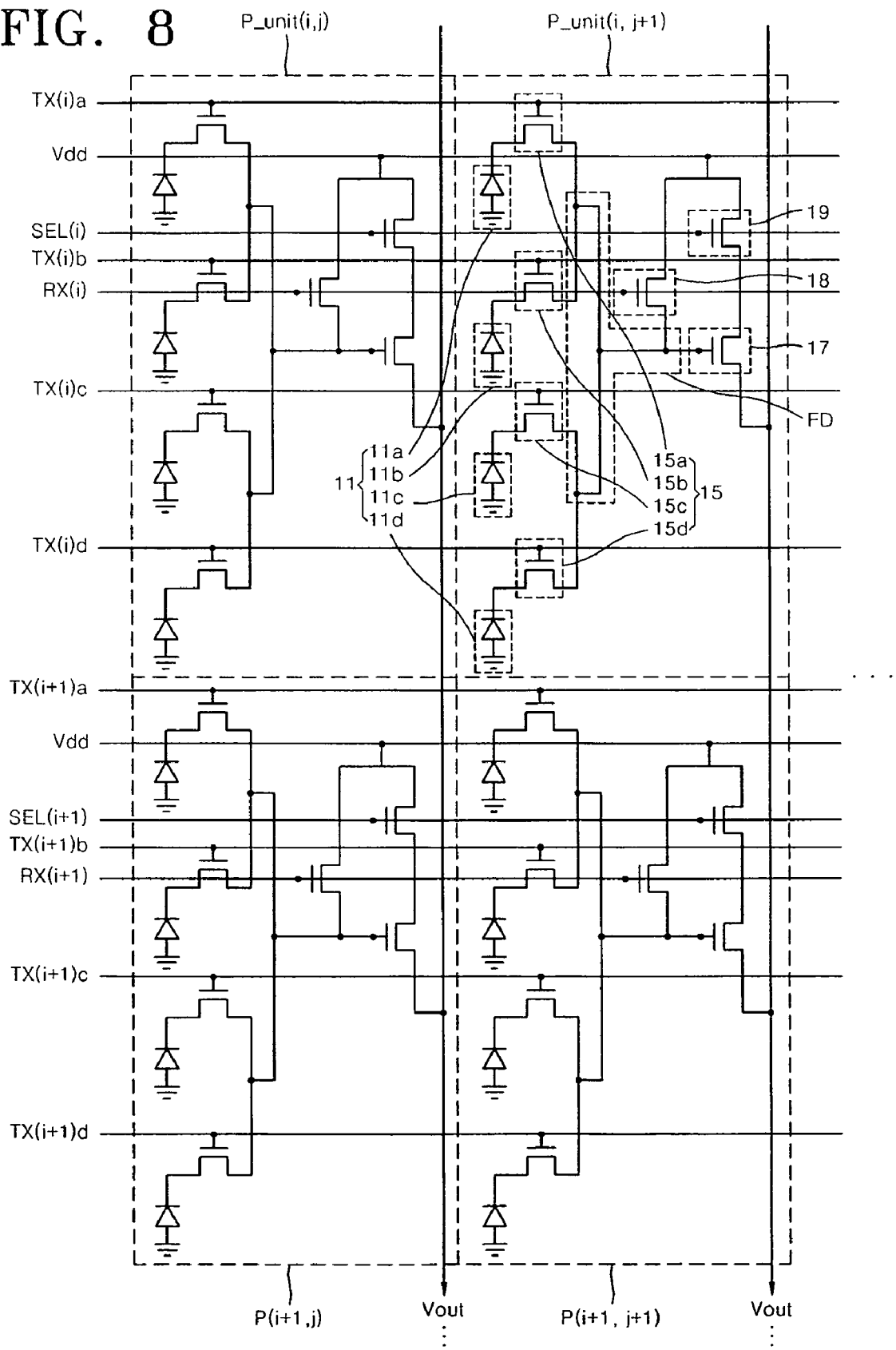
FIG. 8 is a schematic diagram of an APS array circuit of the CIS image sensor of FIG. 1, in accordance with another embodiment of the present invention.

FIG. 8 is a schematic diagram of an APS array circuit of the CIS image sensor of FIG. 1, in accordance with another embodiment of the present invention. This embodiment is comparable to the embodiment of FIG. 2 described above, with the exception that in this embodiment, a pixel unit P_unit (i, j) includes four photoelectric conversion elements 11a, 11b, 11c, 11d, and readout elements including individual corresponding first, second, third and fourth transfer elements 15a, 15b, 15c, 15d, and a shared select element 19, drive element 17 and reset element 18. In this configuration, four adjacent photoelectric conversion elements each have a corresponding transfer element, and each four corresponding photoelectric conversion element/transfer element pairs share a common select element 19, drive element 17 and reset element 18. Also, the floating diffusion region FD is common to the outputs of the first, second, third and fourth transfer elements 15a, 15b, 15c, 15d. The first, second, third and fourth transfer elements 15a, 15b, 15c, 15d are activated in response to corresponding first, second, third, and fourth transfer signals TX(i)a, TX(i)b, TX(i)c, TX(i)d.

Figure 9A:
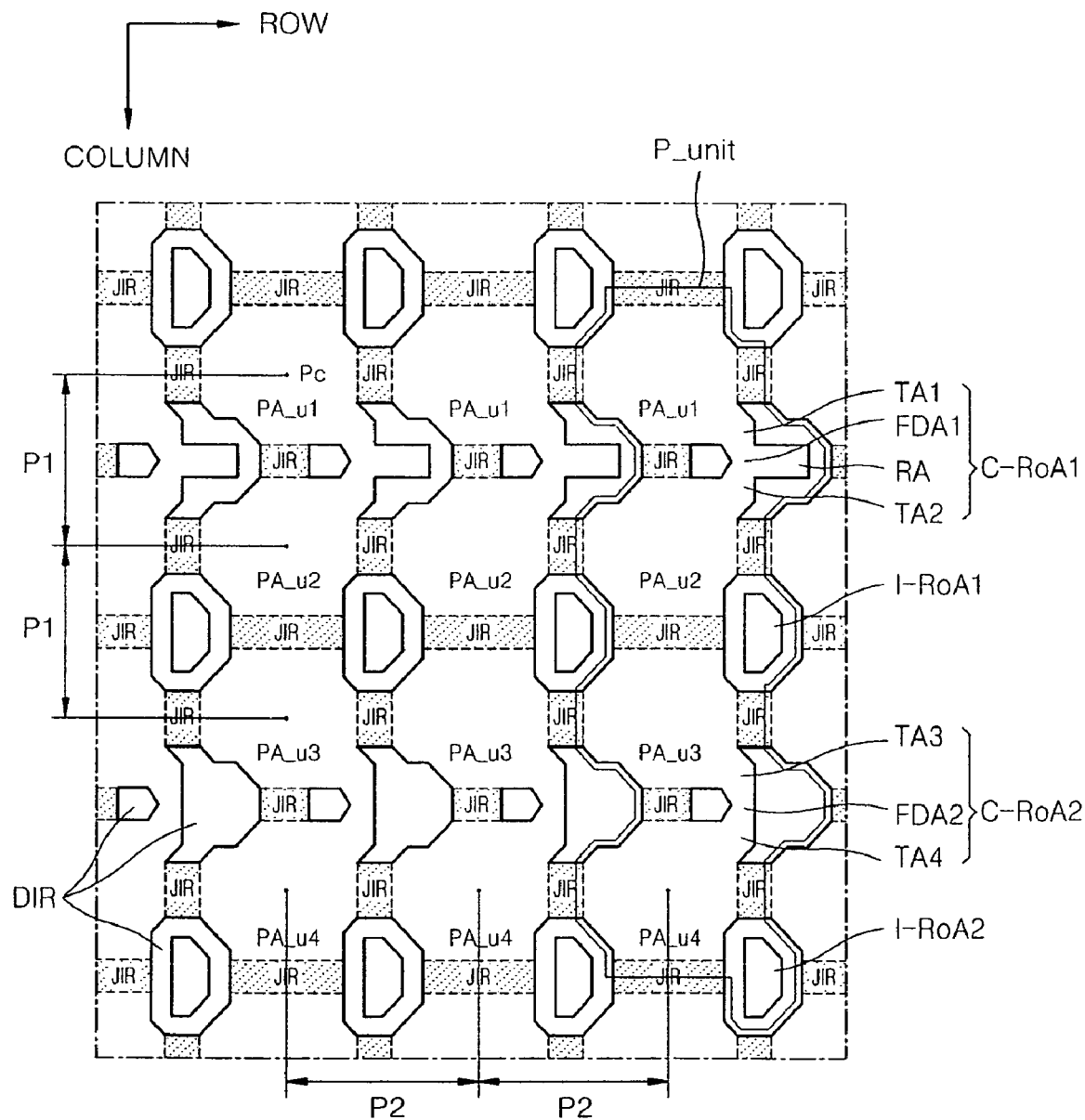
FIGS. 9A and 9B are a top-level layout views of an embodiment of the APS array circuit of FIG. 8, in accordance with an embodiment of the present invention.
Figure 9B:
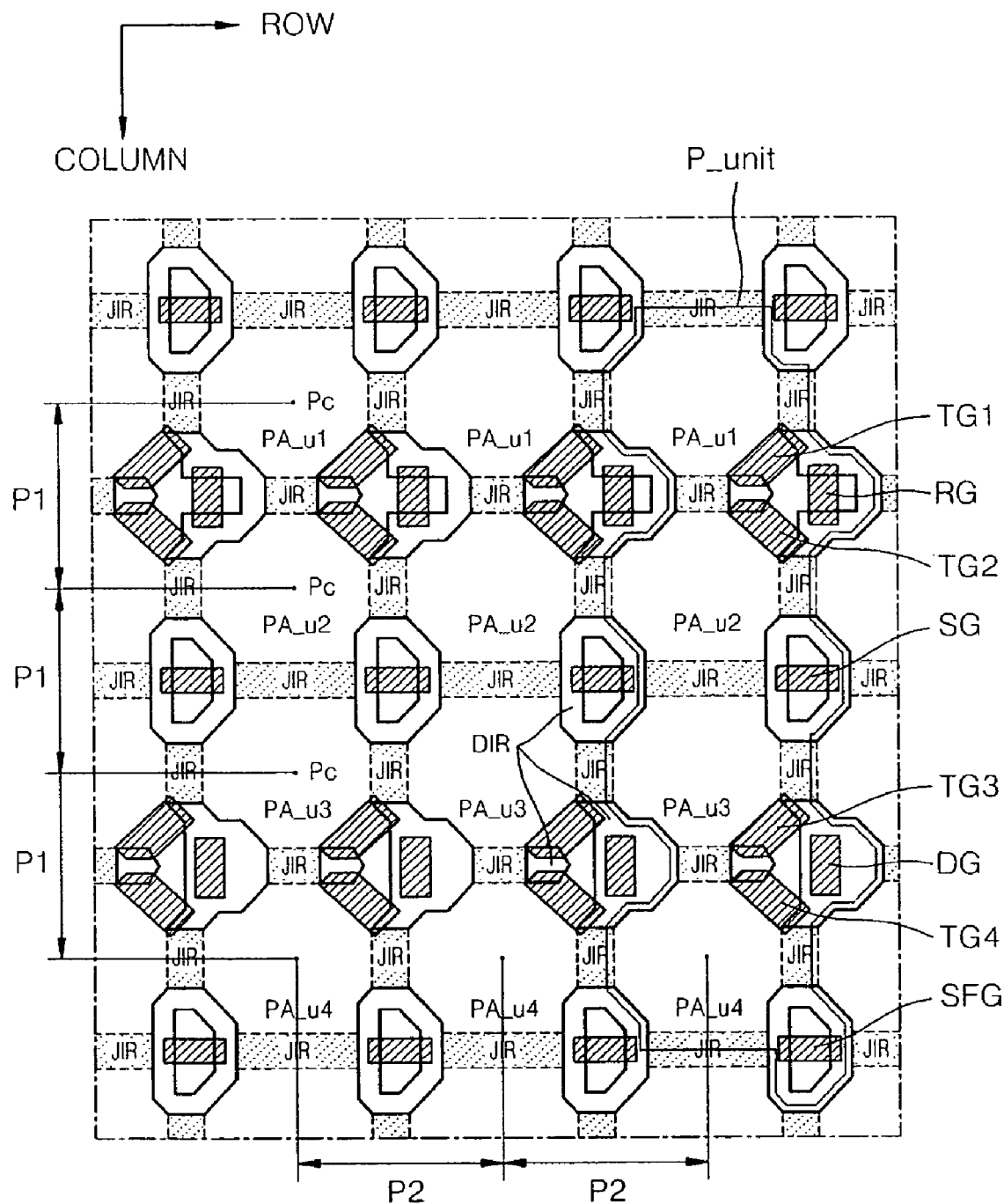

FIGS. 9A and 9B are top-level layout views of an embodiment of the APS array circuit of FIG. 8, in accordance with an embodiment of the present invention. In FIG. 9A, the layout of the photoelectric conversion elements of pixels of the APS array circuit, and corresponding isolation regions isolating neighboring pixels, are shown. In FIG. 9B, the layout of the gates of the readout elements corresponding to the pixels are additionally shown.

With reference to FIGS. 9A and 9B, this embodiment is similar to the embodiment of FIGS. 3A and 3B above. An exception lies in that a pixel unit P_unit of the present embodiment comprises a first photoelectric conversion element PA_u1, a second photoelectric conversion element PA_u2, a third photoelectric conversion element PA_u3, and a fourth photoelectric conversion element PA_u4. The layout of the first through fourth photoelectric conversion elements PA_u1-PA_u4 and the supporting readout elements will be discussed in further detail below.

As in the embodiment of FIGS. 3A and 3B above, in the present embodiment of FIGS. 9A and 9B, alignment of the microlens array and the underlying photoelectric conversion elements is achieved by configuring the device such that the pitch of each pixel in the row direction P2 is substantially constant, and such that the pitch of each pixel in the column direction P1 is substantially constant. For example, the pitch in the row direction P2 refers to distance between the effective centers Pc of the photoelectric conversion elements in the row direction, and the pitch in the column direction P1 refers to distance between the effective centers Pc of the photoelectric conversion elements in the column direction. As described above, maintaining a constant pitch P1, P2 in each of the column and row directions ensures that a corresponding microlens array having a corresponding periodicity between lenses in the column and row directions can be readily provided, while ensuring accurate alignment of the microlens array and the underlying array of photoelectric conversion elements. As mentioned above, while a constant pitch P2 in the row direction and a constant pitch P1 in the column direction is desired in the embodiments of the present invention, it is not necessary that the pitch P2 in the row direction be equal to the pitch P1 in the column direction; however, such an equal pitch P1=P2 would be preferred in certain applications where horizontal-to-vertical image symmetry is desired.

Referring to FIGS. 9A and 9B, a two-dimensional APS pixel array in accordance the present embodiment is arranged in row and column directions. Each pixel includes a photoelectric conversion element PA_u1, PA_u2, PA_u3, PA_u4. Neighboring photoelectric conversion elements in the row direction are electrically isolated from each other. The centers of neighboring photoelectric conversion elements in the row direction have a constant pitch P2. As in the embodiment of FIGS. 3A and 3B above, pairs of neighboring photoelectric conversion elements, for example, photoelectric conversion elements of pair PA_u1, PA_u2, and photoelectric conversion elements of pair PA_u3, PA_u4 in the column direction share a common connected readout active region C-RoA1, C-RoA2 respectively. Neighboring pairs of neighboring photodiodes in the column direction are electrically isolated from each other. For example the first pair including PA_u1 and PA_u2 is electrically isolated from the second first pair including PA_u3 and PA_u4. The centers of neighboring photodiodes in the column direction have a constant pitch P1, including both neighboring photodiodes sharing a common connected readout active region C-RoA1, C-RoA2, and neighboring photodiodes that are electrically isolated from each other.

In the example embodiment of FIGS. 9A and 9B, a first pixel comprises a first photoelectric conversion element PA_u1, a second pixel, neighboring the first pixel in the column direction comprises a second photoelectric conversion element PA_u2, a third pixel, neighboring the second pixel in the column direction comprises a third photoelectric conversion element PA_u3, and a fourth pixel, neighboring the third pixel in the column direction comprises a fourth photoelectric conversion element PA_u4. Together, the first photoelectric conversion element PA_u1, the second photoelectric conversion element PA_u2, the third photoelectric conversion element PA_u3, and the fourth photoelectric conversion element PA_u4 comprise a pixel unit P_unit, for example, corresponding to the pixel unit P_unit (i, j) of FIG. 8. The pixel unit P_unit includes the first photoelectric conversion element PA_u1, the second photoelectric conversion element PA_u2, the third photoelectric conversion element PA_u3, the fourth photoelectric conversion element PA_u4, a first connected readout active region C-RoA1, a second connected readout active region C-RoA2, a first isolated readout active region I-RoA1, and a second isolated readout active region I-RoA2. The readout elements that are used for reading the energy captured at the photoelectric conversion elements PA_u1, PA_u2, PA_u3, PA_u4 are positioned in the first and second connected readout active regions C-RoA1, C-RoA2 and the first and second isolated readout active regions I-RoA1, I-RoA2.

The first and second photoelectric conversion elements PA_u1, PA_u2 of the pixel unit P_unit are connected at the first connected readout active region C-RoA1. In the first connected readout active region C-RoA1, a first transfer gate TG1 on a first transfer element active region TA1 and a second transfer gate TG2 on a second transfer element active region TA2 of the first and second transfer elements 15a, 15b respectively control the flow of charge between the first and second photoelectric conversion elements PA_u1, PA_u2 respectively, and a common first floating diffusion region FDA1. The third and fourth photoelectric conversion elements PA_u3, PA_u4 of the pixel unit P_unit are connected at the second connected readout active region C-RoA2. In the second connected readout active region C-RoA2, a third transfer gate TG3 on a third transfer element active region TA3 and a fourth transfer gate TG4 on a fourth transfer element active region TA4 of the third and fourth transfer elements 15c, 15d respectively control the flow of charge between the third and fourth photoelectric conversion elements PA_u3, PA_u4 respectively, and a common second floating diffusion region FDA2. The first and second floating diffusion regions FDA1, FDA2 are electrically connected by an upper layer to provide a common floating diffusion node FD for the pixel unit P_unit.

A shared reset gate RG on a reset element active region RA of the reset element 18 controls the flow of charge between the power source Vdd and the common floating diffusion node FD, for resetting the common floating diffusion node FD. In the first isolated readout active region I-RoA1 the select element 19 that is shared by the common pixel unit P_unit is located. A shared select gate SG on a select element active region SA of the select element 19 is located on the first isolated readout active region I-RoA1. In the second isolated readout active region I-RoA2 the drive element 17 that is shared by the common pixel unit P_unit is located. A shared drive gate SFG on a drive element active region of the drive element 17 is located on the second isolated readout active region I-RoA2. A dummy gate DG is provided on the DIR structure corresponding to the second connected readout active region C-RoA2, in order to provide for pattern repeatability in forming the transfer gates TG1, TG2, TG3, and TG4. Without the presence of the dummy gate, the third and fourth transfer gates TG3, TG4 may be formed to different dimensions than the first and second transfer gates TG1, TG2, due to the optical proximity effect.

As in the embodiment of FIG. 3A and FIG. 3B described above, the first, second, third and fourth photoelectric conversion elements PA_u1, PA_u2, PA_u3, PA_u4 of a common pixel unit P_unit are isolated from neighboring photoelectric conversion elements of neighboring pixel units by two forms of isolation, namely, dielectric isolation regions (DIR) and junction isolation regions (JIR).

Referring to FIGS. 9A and 9B, it can be seen that in the present exemplary configuration of the present embodiment, the photoelectric conversion elements PA_u1, PA_u2 are arranged in rows and columns extending in a first direction and a second direction respectively of a substrate. A plurality of first junction isolation regions JIR are formed in the substrate that each isolate side portions of neighboring photoelectric conversion elements of a common row, for example PA_u1, PA_u1 or PA_u2, PA_u2 or PA_u3, PA_u3 or PA_u4, PA_u4, and a plurality of second junction isolation regions JIR are formed in the substrate that each isolate side portions of neighboring photoelectric conversion elements of a common column, for example neighboring elements PA_u1, PA_u2, PA_u3, PA_u4. A plurality of dielectric isolation regions DIR are also provided in the substrate, each isolating corner portions of the neighboring photoelectric conversion elements. The photoelectric conversion elements PA_u1, PA_u2, PA_u3, PA_u4 have a first pitch P2 in the row direction and have a second pitch P1 in the column direction. The first pitch P2 is substantially constant, or substantially equal, for the photoelectric conversion elements PA_u1, PA_u2, PA_u3, PA_u4 of a common row, and the second pitch P1 is substantially constant, or substantially equal, for the photoelectric conversion elements PA_u1, PA_u2, PA_u3, PA_u4 of a common column. This embodiment offers many of the same advantages as those described above in connection with the previous embodiments.

Figure 10:
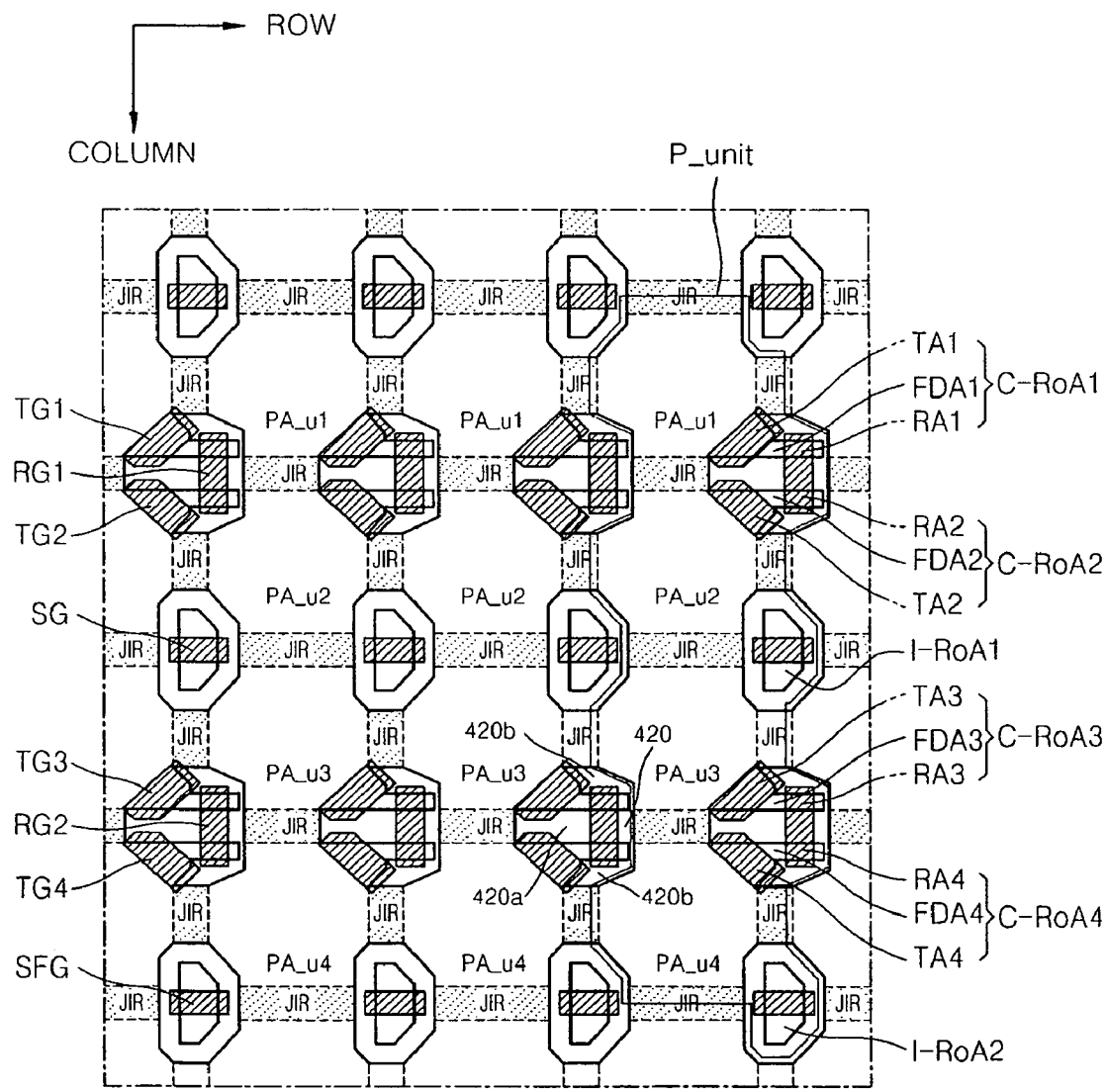
FIG. 10 is a top-level layout view of another embodiment of the APS array circuit of FIG. 8, including the layout of the photoelectric conversion elements of pixels of the APS array circuit, and corresponding isolation regions isolating neighboring pixels, along with the layout of the gates of the readout elements corresponding to the pixels, in accordance with the present invention.

FIG. 10 is a top-level layout view of another embodiment of the APS array circuit of FIG. 8, including the layout of the photoelectric conversion elements of pixels of the APS array circuit, and corresponding isolation regions isolating neighboring pixels, along with the layout of the gates of the readout elements corresponding to the pixels, in accordance with the present invention. This embodiment shares many similarities with the embodiment of FIGS. 9A and 9B above. These similarities are not repeated in the description of the present embodiment. A difference in the present embodiment lies in that the active layer of the first photoelectric conversion element PA_u1 and the active layer of the second photoelectric conversion element PA_u2 are not electrically connected at a common floating diffusion region FD as in the embodiment depicted in FIGS. 9A and 9B. Instead, in the present embodiment, the active layers of the first and second photoelectric conversion elements of each pixel unit P_unit are isolated by a DIR isolation structure. For example, a bottom, right corner portion of the first photoelectric conversion element PA_u1 and a top, right corner portion of the second photoelectric conversion element PA_u2 are electrically isolated by the DIR isolation structure 420. In this example, the DIR isolation structure 420 includes a body portion 420a that extends in the row direction between neighboring JIR isolation regions, and further includes first and second wing portions 420b that each extend in the column direction between neighboring JIR isolation regions. Isolation using a similar DIR structure is provided between the active layer of the third photoelectric conversion element PA_u3 and the active layer of the fourth photoelectric conversion element PA_u4.

In the example embodiment of FIG. 10, a first connected readout active region C-RoA1 is connected to the active region of the first photoelectric conversion element PA_u1, a second connected readout active region C-RoA2 is connected to the active region of the second photoelectric conversion element PA_u2, a third connected readout active region C-RoA3 is connected to the active region of the third photoelectric conversion element PA_u3 and a fourth connected readout active region C-RoA4 is connected to the active region of the fourth photoelectric conversion element PA_u4. In the first connected readout active region C-RoA1, a first transfer gate TG1 of a first transfer element and a first reset gate RG1 of a first reset element are located at opposite sides of a first floating diffusion region FDA1. In the second connected readout active region C-RoA2, a second transfer gate TG2 of a second transfer element and a second reset gate RG2 of a second reset element are located at opposite sides of a second floating diffusion region FDA2. In the third connected readout active region C-RoA3, a third transfer gate TG3 of a third transfer element and a third reset gate RG3 of a third reset element are located at opposite sides of a third floating diffusion region FDA3. In the fourth connected readout active region C-RoA4, a fourth transfer gate TG4 of a fourth transfer element and a fourth reset gate RG4 of a fourth reset element are located at opposite sides of a fourth floating diffusion region FDA4. Like the embodiment of FIGS. 9A and 9B above, a shared select gate SG of a select element and a shared drive gate SFG of a drive element are located in the first and second isolated readout active regions I-RoA1, I-RoA2. This embodiment offers many of the same advantages as those described above in connection with the previous embodiments.

Figure 11:
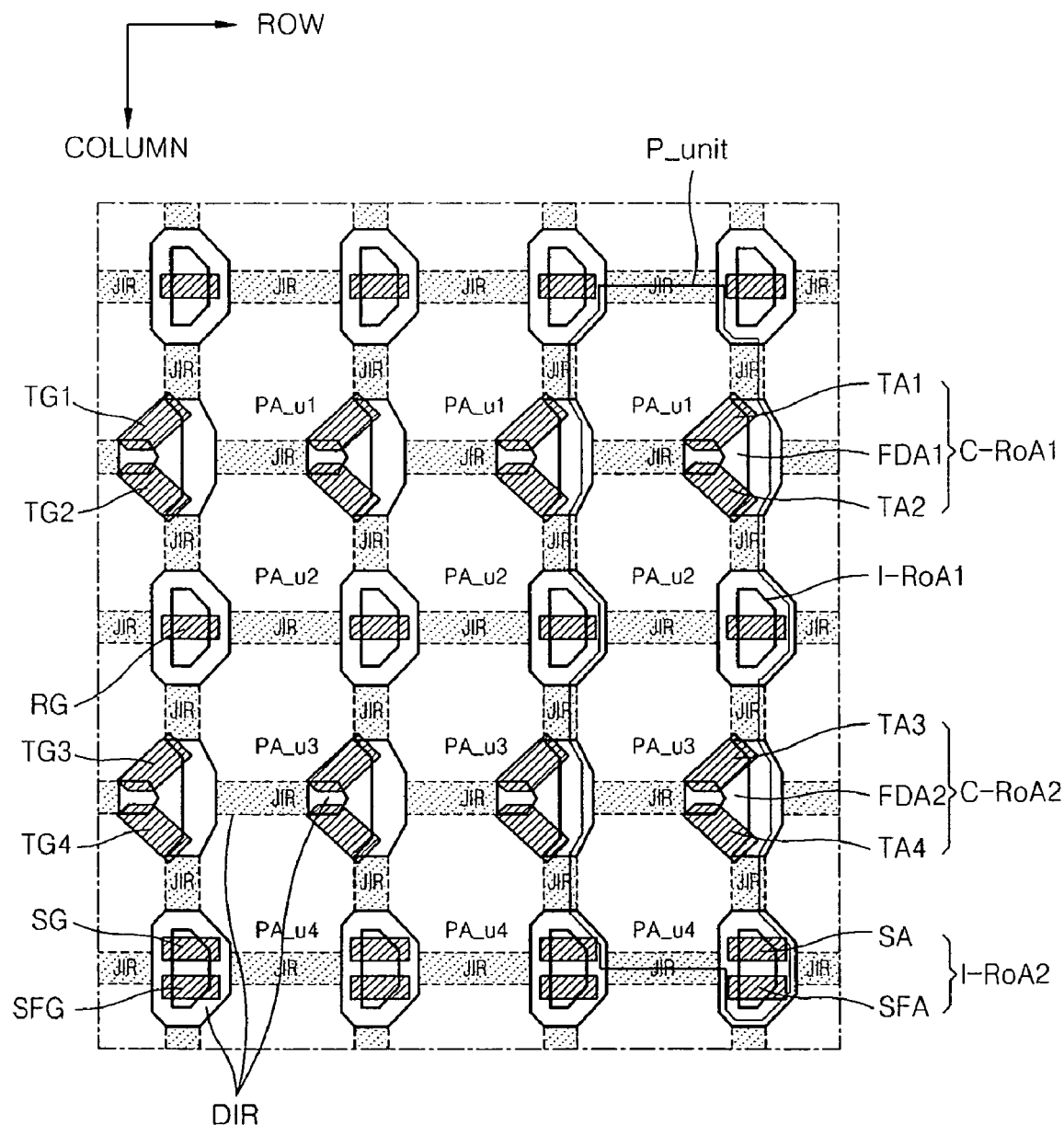
FIG. 11 is a top-level layout view of another embodiment of the APS array circuit of FIG. 8, including the layout of the photoelectric conversion elements of pixels of the APS array circuit, and corresponding isolation regions isolating neighboring pixels, along with the layout of the gates of the readout elements corresponding to the pixels, in accordance with the present invention.

FIG. 11 is a top-level layout view of another embodiment of the APS array circuit of FIG. 8, including the layout of the photoelectric conversion elements of pixels of the APS array circuit, and corresponding isolation regions isolating neighboring pixels, along with the layout of the gates of the readout elements corresponding to the pixels, in accordance with the present invention. This embodiment shares many similarities with the embodiment of FIGS. 9A and 9B above. These similarities are not repeated in the description of the present embodiment. A difference in the present embodiment lies in that the reset gate RG of the reset element 18 is provided on the first isolated readout active region I-RoA1, while the select gate SG of the select element 19 and the drive gate SFG of the drive element 17 are both provided on the second isolated readout active region I-RoA2. This embodiment offers many of the same advantages as those described above in connection with the previous embodiments.

Figure 12:
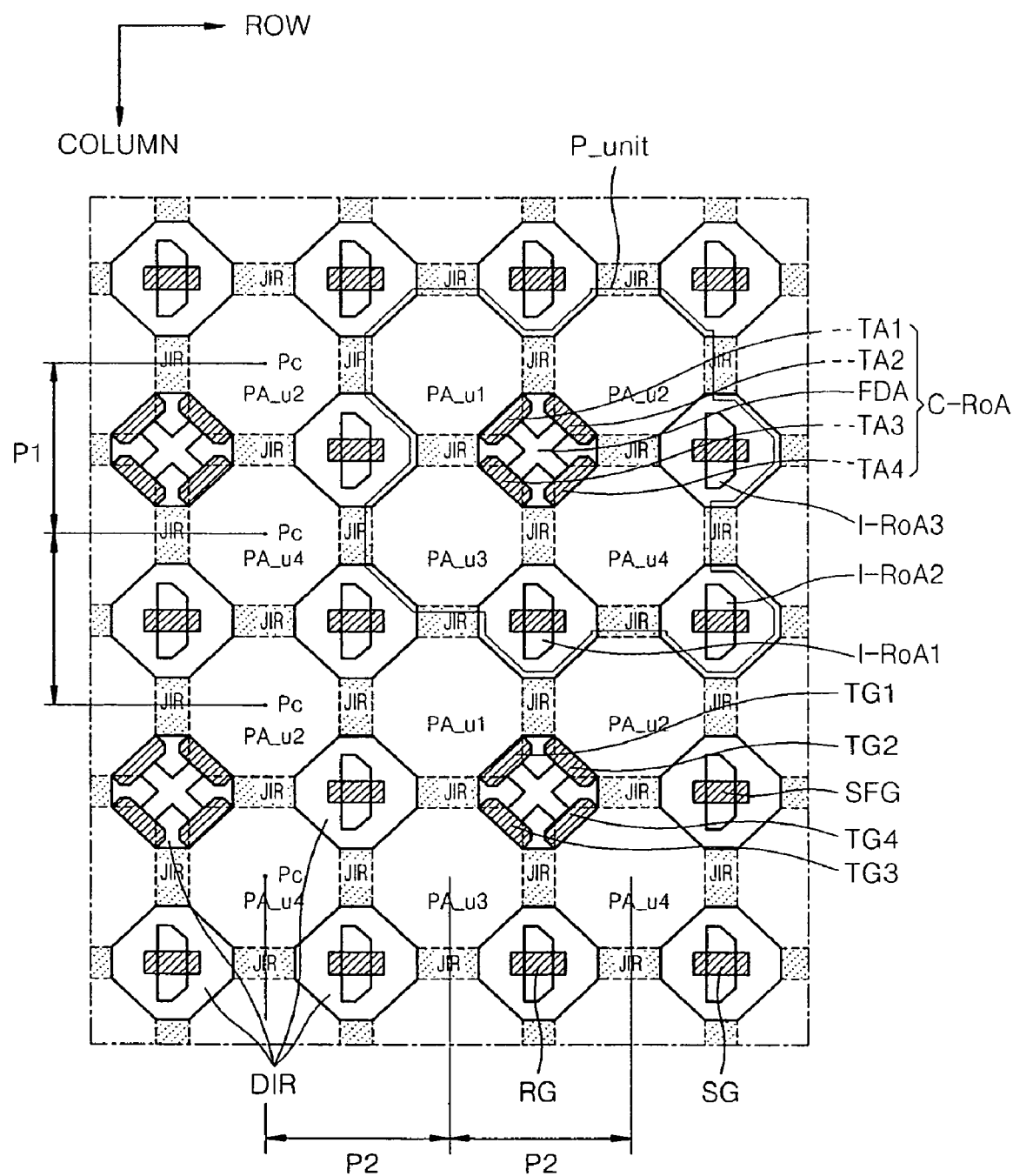
FIG. 12 is a top-level layout view of another embodiment of the APS array circuit of FIG. 8, including the layout of the photoelectric conversion elements of pixels of the APS array circuit, and corresponding isolation regions isolating neighboring pixels, along with the layout of the gates of the readout elements corresponding to the pixels, in accordance with the present invention.

FIG. 12 is a top-level layout view of another embodiment of the APS array circuit of FIG. 8, including the layout of the photoelectric conversion elements of pixels of the APS array circuit, and corresponding isolation regions isolating neighboring pixels, along with the layout of the gates of the readout elements corresponding to the pixels, in accordance with the present invention. This embodiment is another example of a shared-type image sensor in which four neighboring photoelectric conversion elements share common readout elements, for example in accordance with the schematic diagram of FIG. 8 above. However, in this embodiment, a pixel unit P_unit of the four neighboring photoelectric conversion elements is not arranged to include four photoelectric conversion elements of a common column, as in the embodiments of FIGS. 9A, 9B, 10 and 11 above. Instead, in the present embodiment, the four neighboring photoelectric conversion elements PA_u1, PA_u2, PA_u3, PA_u4 are arranged to extend in both row and column directions as shown. For example, first and second photoelectric conversion elements PA_u1 and PA_u2 neighbor each other in a common first row, and third and fourth photoelectric conversion elements PA_u3 and PA_u4 neighbor each other in a common second row. At the same time, first and third photoelectric conversion elements PA_u1 and PA_u3 neighbor each other in a common first column, and second and fourth photoelectric conversion elements PA_u2 and PA_u4 neighbor each other in a common second column.

Together, the first photoelectric conversion element PA_u1, the second photoelectric conversion element PA_u2, the third photoelectric conversion element PA_u3, and the fourth photoelectric conversion element PA_u4 comprise a pixel unit P_unit, for example, corresponding to the pixel unit P_unit (i, j) of FIG. 8. The pixel unit P_unit includes the first photoelectric conversion element PA_u1, the second photoelectric conversion element PA_u2, the third photoelectric conversion element PA_u3, the fourth photoelectric conversion element PA_u4, a connected readout active region C-RoA, a first isolated readout active region I-RoA1, a second isolated readout active region I-RoA2, and a third isolated readout active region I-RoA3. The readout elements that are used for reading the energy captured at the photoelectric conversion elements PA_u1, PA_u2, PA_u3, PA_u4 are positioned in the connected readout active region C-RoA and in the first, second, and third isolated readout active regions I-RoA1, I-RoA2, I-RoA3.

The first, second, third and fourth photoelectric conversion elements PA_u1, PA_u2, PA_u3, PA_u4 of the pixel unit P_unit are connected at the connected readout active region C-RoA. In the first connected readout active region C-RoA1, a first transfer gate TG1, a second transfer gate TG2, a third transfer gate TG3, and a fourth transfer gate TG4 of the first, second, third and fourth transfer elements 15a, 15b, 15c, 15d respectively control the flow of charge between the first, second third and fourth photoelectric conversion elements PA_u1, PA_u2, PA_u3, PA_u4 respectively, and a common floating diffusion region FDA.

In the first isolated readout active region I-RoA1, a shared reset gate RG of the reset element 18 is located. The shared reset gate RG of the reset element 18 controls the flow of charge between the power source Vdd and the common floating diffusion region FDA, for resetting the common floating diffusion region FDA. In the second isolated readout active region I-RoA2 the select element 19 that is shared by the common pixel unit P_unit is located. A shared select gate SG of the select element 19 is located on the second isolated readout active region I-RoA2. In the third isolated readout active region I-RoA3 the drive element 17 that is shared by the common pixel unit P_unit is located. A shared drive gate SFG of the drive element 17 is located on the third isolated readout active region I-RoA3. As in the above embodiments, in other configurations of the present embodiment, two of the shared gates can be located on a common isolated readout active region I-RoA1, I-RoA2, or I-RoA3, and the other of the shared gates located on a remaining isolated readout active region, or, alternatively, all three of the shared gates can be located on a common isolated readout active region I-RoA1, I-RoA2, or I-RoA3.

As in the above embodiments, the first, second, third and fourth photoelectric conversion elements PA_u1, PA_u2, PA_u3, PA_u4 of a common pixel unit P_unit are isolated from neighboring photoelectric conversion elements of neighboring pixel units by two forms of isolation, namely, dielectric isolation regions (DIR) and junction isolation regions (JIR). Referring to FIG. 12 it can be seen that a plurality of first junction isolation regions JIR are formed in the substrate that each isolate side portions of neighboring photoelectric conversion elements of a common row and isolate side portions of neighboring photoelectric conversion elements of a common column. A plurality of dielectric isolation regions DIR are also provided in the substrate, each isolating corner portions of the neighboring photoelectric conversion elements. The photoelectric conversion elements PA_u1, PA_u2, PA_u3, PA_u4 have a first pitch P2 in the row direction and have a second pitch P1 in the column direction. The first pitch P2 is substantially constant, or substantially equal for the photoelectric conversion elements PA_u1, PA_u2, PA_u3, PA_u4 of a common row, and the second pitch P1 is substantially constant, or substantially equal for the photoelectric conversion elements PA_u1, PA_u2, PA_u3, PA_u4 of a common column.

Figure 13:
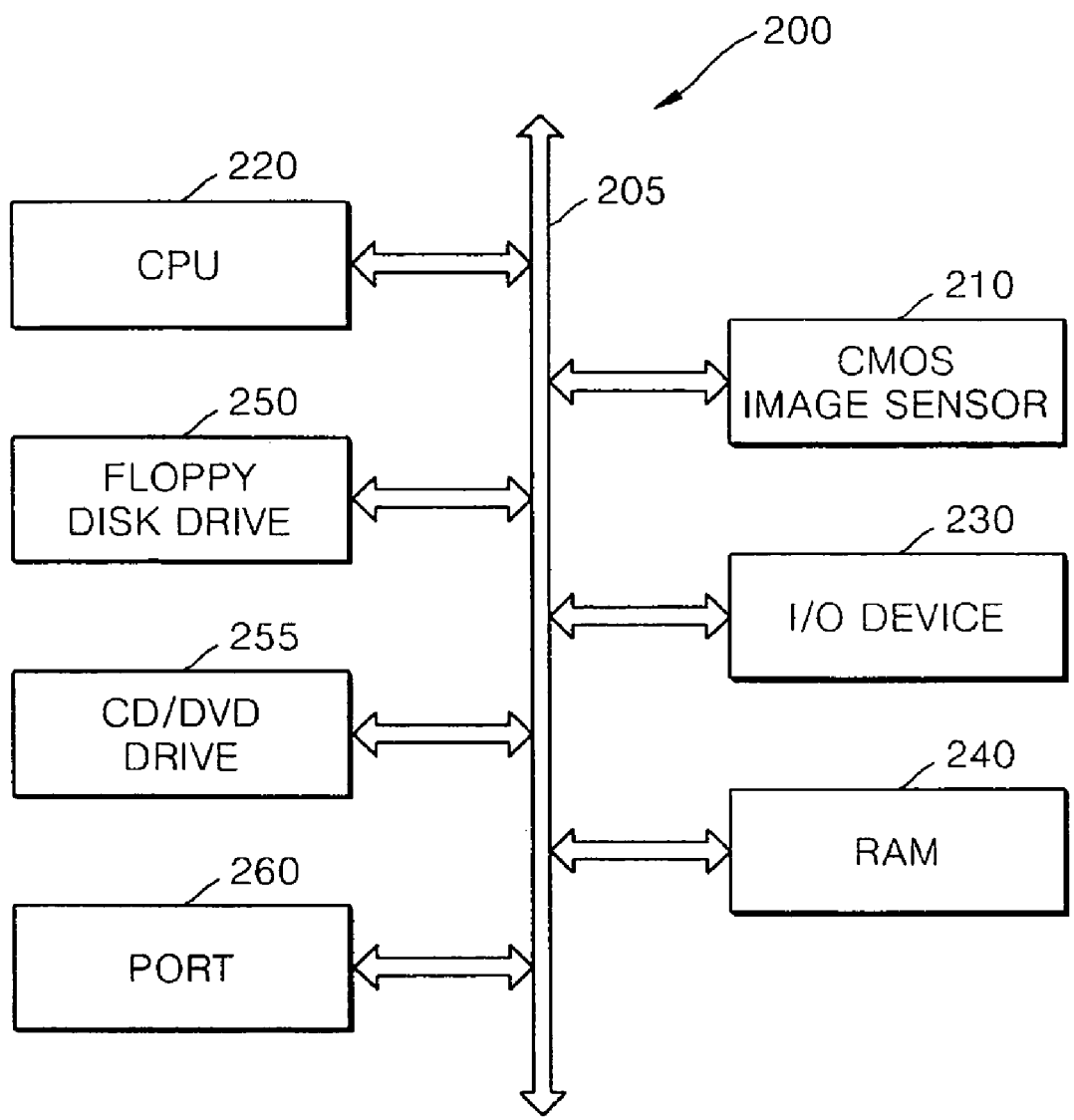
FIG. 13 is a block diagram of a system that includes an image sensor comprising an APS array circuit in accordance with the embodiments described above, in accordance with the present invention.

FIG. 13 is a block diagram of a system that includes an image sensor comprising an APS array circuit in accordance with the embodiments described above, in accordance with the present invention. The system 200 includes a processor 220 that is connected to a memory 240 via a data bus 205. The processor 220 processes image data signals that are output by an image sensor 210. The memory 240 stores and retrieves the image data signals output by the image sensor 210. Media drives, for example comprising a floppy disk drive 250 or a CD/DVD drive 255 are connected to the data bus for storing the image data signals on a medium. An input/output device 230 and data port are connected to the data bus for providing control signals to the processor 220 from an external device and for transferring the image data signals to an external device, such as a display. In this manner, the imaging device 210 configured in accordance with the above embodiments is incorporated into an imaging system 200 to provide the advantages described above. The imaging system 200 described above has application in many types of electronic systems, including computer systems, camera systems, navigation systems, video systems, scanner systems, and closed circuit television systems (CCTV).

In this manner, the described embodiments provide for an increased device fill factor by providing a shared-type imaging device configuration, while maintaining a constant pitch in the row direction and a constant pitch in the column direction, so that alignment between microlenses to be provided above the photoelectric conversion elements, and the photoelectric conversion elements, is ensured. Both DIR and JIR isolation structures are provided for isolating neighboring photoelectric conversion elements, in order to achieve a higher fill factor, and in order to provide for the constant pitch in both row and column directions. This leads to higher device sensitivity and lower crosstalk, providing enhanced resolution in the captured images.

While the invention has been particularly shown and described with references to preferred embodiments thereof, it will be understood by those skilled in the art that various changes in form and details may be made herein without departing from the spirit and scope of the invention as defined by the appended claims.

For example, while the above exemplary embodiments illustrate a shared-type image sensor in which two or four photoelectric conversion elements share common readout elements, the present invention is not limited to these number of shared photoelectric conversion elements, and extends to other pluralities of shared photoelectric conversion elements, for example, an odd number such as three or five, or other even numbers, such as six, eight, or more.

What is claimed is:

1. An image sensor comprising:
    an array of photoelectric conversion elements in a substrate, the photoelectric conversion elements being arranged in rows and columns extending in a first direction and a second direction respectively;

a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column, wherein the junction isolation regions comprise regions of the substrate that are doped with impurities; and a plurality of dielectric isolation regions in the substrate, that each isolate corner portions of neighboring photoelectric conversion elements, wherein the dielectric isolation regions comprise portions of a dielectric insulation material that are provided in the substrate.

2. The image sensor of claim 1 wherein the photoelectric conversion elements have a first pitch in the first direction and have a second pitch in the second direction and wherein the first pitch is substantially equal for the photoelectric conversion elements of a common row, and wherein the second pitch is substantially equal for the photoelectric conversion elements of a common column.

3. The image sensor of claim 1 wherein the photoelectric conversion elements comprise photoelectric active regions that are formed in the substrate.

4. The image sensor of claim 1 wherein the substrate includes an epitaxial layer and wherein the photoelectric conversion elements comprise photoelectric active regions that are formed in the epitaxial layer.

5. The image sensor of claim 1 wherein the dielectric isolation regions are formed in one of a shallow trench isolation (STI) and a local oxidation of silicon (LOCOS) process.

6. The image sensor of claim 1 wherein the first direction and the second direction comprise a horizontal direction and a vertical direction that are perpendicular to each other.

7. The image sensor of claim 1 wherein at least two neighboring photoelectric conversion elements in at least one of the rows and columns share a common photoelectric active region.

8. The image sensor of claim 1 wherein two neighboring photoelectric conversion elements of a common row or column each have a corresponding transfer element, and share a common reset element, select element and drive element.

9. The image sensor of claim 1 wherein two neighboring photoelectric conversion elements of a common row or column each have a corresponding transfer element and reset element, and share a common select element and drive element.

10. The image sensor of claim 1 wherein four neighboring photoelectric conversion elements of a common row or column each have a corresponding transfer element, and share a common reset element, select element and drive element.

11. The image sensor of claim 1 wherein four neighboring photoelectric conversion elements of a common row or column each have a corresponding transfer element and reset element, and share a common select element and drive element.

12. The image sensor of claim 1 wherein four neighboring photoelectric conversion elements of a common row or column each have a corresponding transfer element, and share a common reset element, select element and drive element.

13. The image sensor of claim 1 wherein four neighboring photoelectric conversion elements of two neighboring rows and columns each have a corresponding transfer element, and share a common reset element, select element and drive element.

14. The image sensor of claim 1 further comprising an array of microlenses formed over the photoelectric conversion elements, the microlenses being arranged in rows and columns, each microlens having a focal point that is directed at a corresponding photoelectric conversion element.

15. The image sensor of claim 1, wherein each photoelectric conversion element abuts at least one of the plurality of first junction isolation regions, at least one of the plurality of second junction isolation regions, and at least one of the plurality of dielectric isolation regions.

16. The image sensor of claim 1, wherein at least one of the plurality of dielectric isolation regions abuts at least one of the plurality of first junction isolation regions and at least one of the plurality of second junction isolation regions.

17. The image sensor of claim 2 further comprising an array of microlenses formed over the photoelectric conversion elements, the microlenses being arranged in rows and columns, each microlens having a focal point that is aligned with a corresponding photoelectric conversion element, wherein the focal points of the microlenses are arranged to have a first pitch in the first direction and a second pitch in the second direction that are substantially equal to the first pitch of the photoelectric conversion elements, respectively.

18. The image sensor of claim 2 wherein the first pitch is equal to the second pitch.

19. The image sensor of claim 7 wherein the neighboring photoelectric conversion elements each comprise a photoelectric active region that is isolated by junction isolation regions at top and bottom portions thereof and at left and right portions thereof, and at dielectric isolation regions at corner portions thereof between the junction isolation regions, one of the dielectric isolation regions being partitioned into two dielectric isolation region segments through which the photoelectric active region is connected to the other neighboring photoelectric element, a first of the two dielectric isolation region segments adjacent a first junction isolation region and a second of the two dielectric isolation region segments adjacent a second junction isolation region, and a connecting portion of the common photoelectric active region extending through the first and second dielectric isolation region segments.

20. The image sensor of claim 19 further comprising at least two transfer elements on the active region that operate to separate the common active region of the at least two neighboring photoelectric conversion elements into first and second photoelectric active regions of first and second photoelectric conversion elements.

21. The image sensor of claim 8 wherein at least one of the dielectric isolation regions surrounds an isolated active region portion and wherein the select element and drive element are formed at a common isolated active region at a corner portion of one of the photoelectric conversion elements.

22. The image sensor of claim 9 wherein at least one of the dielectric isolation regions surrounds an isolated active region and wherein the select element and drive element are formed at a common isolated active region at a corner portion of one of the photoelectric conversion elements.

23. The image sensor of claim 10 wherein at least one of the dielectric isolation regions surrounds an isolated active region and wherein the select element and drive element are formed at different isolated active regions at corner portions of one of the photoelectric conversion elements.

24. The image sensor of claim 11 wherein at least one of the dielectric isolation regions surrounds an isolated active region and wherein the select element and drive element are formed at different isolated active regions at corner portions of the photoelectric conversion elements.

25. The image sensor of claim 12 wherein at least one of the dielectric isolation regions surrounds an isolated active region and wherein the select element and drive element are formed at a common first isolated active region, and wherein the reset element is formed at a second isolated active region that is separated from the first isolated active region, the first and second isolated active regions being positioned at corner portions of corresponding photoelectric conversion elements.

26. The image sensor of claim 13 wherein at least one of the dielectric isolation regions surrounds an isolated active region and wherein the reset element, select element and drive element are formed at different isolated active regions at corner portions of the photoelectric conversion elements.

27. The image sensor of claim 13 wherein at least one of the dielectric isolation regions surrounds an isolated active region and wherein two of the select element, drive element, and reset element are formed at a common first isolated active region, and wherein the other of the select element, drive element, and reset element is formed at a second isolated active region that is separated from the first isolated active region, the first and second isolated active regions being positioned at corner portions of corresponding photoelectric conversion elements.

28. The image sensor of claim 13 wherein the four neighboring photoelectric elements share a common photoelectric active region.

29. An image sensing system comprising:
a processor connected to a data bus that processes image data signals output by an image sensor;
a memory connected to the data bus that stores and retrieves the image data signals output by the image sensor; and
an image sensor connected to the data bus that generates the image data signals comprising:
an array of photoelectric conversion elements in a substrate, the photoelectric conversion elements being arranged in rows and columns extending in a first direction and a second direction respectively;
a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column, wherein the junction isolation regions comprise regions of the substrate that are doped with impurities; and
a plurality of dielectric isolation regions in the substrate, that each isolate corner portions of neighboring photoelectric conversion elements, wherein the dielectric isolation regions comprise portions of a dielectric insulation material that are provided in the substrate,
wherein each of the photoelectric conversion elements generates an electric signal in response to photon energy received at the photoelectric conversion element, the image data signals comprising the output signals of multiple photoelectric conversion elements.

30. The system of claim 29 further comprising at least one of:
a media drive connected to the data bus that stores the image data signals on a medium;
an input device connected to the data bus at which control signals are input to the processor for controlling the processing of the image data signals; and
a data port connected to the data bus for transferring the image data signals to an external device.

31. The system of claim 29 wherein the photoelectric conversion elements have a first pitch in the first direction and have a second pitch in the second direction and wherein the first pitch is substantially equal for the photoelectric conversion elements of a common row, and wherein the second pitch is substantially equal for the photoelectric conversion elements of a common column.

32. The system of claim 29 wherein the photoelectric conversion elements comprise photoelectric active regions that are formed in the substrate.

33. The system of claim 29 wherein the substrate includes an epitaxial layer and wherein the photoelectric conversion elements comprise photoelectric active regions that are formed in the epitaxial layer.

34. The system of claim 29 wherein the dielectric isolation regions are formed in one of a shallow trench isolation (STI) and a local oxidation of silicon (LOCOS) process.

35. The system of claim 29 wherein the first direction and the second direction comprise a horizontal direction and a vertical direction that are perpendicular to each other.

36. The system of claim 29 wherein at least two neighboring photoelectric conversion elements in at least one of the rows and columns share a common photoelectric active region.

37. The system of claim 29 wherein two neighboring photoelectric conversion elements of a common row or column each have a corresponding transfer element, and share a common reset element, select element and drive element.

38. The system of claim 29 wherein two neighboring photoelectric conversion elements of a common row or column each have a corresponding transfer element and reset element, and share a common select element and drive element.

39. The system of claim 29 wherein four neighboring photoelectric conversion elements of a common row or column each have a corresponding transfer element, and share a common reset element, select element and drive element.

40. The system of claim 29 wherein four neighboring photoelectric conversion elements of a common row or column each have a corresponding transfer element and reset element, and share a common select element and drive element.

41. The system of claim 29 wherein four neighboring photoelectric conversion elements of a common row or column each have a corresponding transfer element, and share a common reset element, select element and drive element.

42. The system of claim 29 wherein four neighboring photoelectric conversion elements of two neighboring rows and columns each have a corresponding transfer element, and share a common reset element, select element and drive element.

43. The system of claim 29 further comprising an array of microlenses formed over the photoelectric conversion elements, the microlenses being arranged in rows and columns, each microlens having a focal point that is directed at a corresponding photoelectric conversion element.

44. The system of claim 29, wherein each photoelectric conversion element abuts at least one of the plurality of first junction isolation regions, at least one of the plurality of second junction isolation regions, and at least one of the plurality of dielectric isolation regions.

45. The system of claim 29, wherein at least one of the plurality of dielectric isolation regions abuts at least one of the plurality of first junction isolation regions and at least one of the plurality of second junction isolation regions.

46. The system of claim 31 further comprising an array of microlenses formed over the photoelectric conversion elements, the microlenses being arranged in rows and columns, each microlens having a focal point that is aligned with a corresponding photoelectric conversion element, wherein the focal points of the microlenses are arranged to have a first pitch in the first direction and a second pitch in the second direction that are substantially equal to the first pitch of the photoelectric conversion elements, respectively.

47. The system of claim 30 wherein the first pitch is equal to the second pitch.

48. The system of claim 36 wherein the neighboring photoelectric conversion elements each comprise a photoelectric active region that is isolated by junction isolation regions at top and bottom portions thereof and at left and right portions thereof, and at dielectric isolation regions at corner portions thereof between the junction isolation regions, one of the dielectric isolation regions being partitioned into two dielectric isolation region segments through which the photoelectric active region is connected to the other neighboring photoelectric element, a first of the two dielectric isolation region segments adjacent a first junction isolation region and a second of the two dielectric isolation region segments adjacent a second junction isolation region, and a connecting portion of the common photoelectric active region extending through the first and second dielectric isolation region segments.

49. The system of claim 48 further comprising at least two transfer elements on the active region that operate to separate the common active region of the at least two neighboring photoelectric conversion elements into first and second photoelectric active regions of first and second photoelectric conversion elements.

50. The system of claim 37 wherein at least one of the dielectric isolation regions surrounds an isolated active region portion and wherein the select element and drive element are formed at a common isolated active region at a corner portion of one of the photoelectric conversion elements.

51. The system of claim 38 wherein at least one of the dielectric isolation regions surrounds an isolated active region and wherein the select element and drive element are formed at a common isolated active region at a corner portion of one of the photoelectric conversion elements.

52. The system of claim 39 wherein at least one of the dielectric isolation regions surrounds an isolated active region and wherein the select element and drive element are formed at different isolated active regions at corner portions of one of the photoelectric conversion elements.

53. The system of claim 40 wherein at least one of the dielectric isolation regions surrounds an isolated active region and wherein the select element and drive element are formed at different isolated active regions at corner portions of the photoelectric conversion elements.

54. The system of claim 41 wherein at least one of the dielectric isolation regions surrounds an isolated active region and wherein the select element and drive element are formed at a common first isolated active region, and wherein the reset element is formed at a second isolated active region that is separated from the first isolated active region, the first and second isolated active regions being positioned at corner portions of corresponding photoelectric conversion elements.

55. The system of claim 42 wherein at least one of the dielectric isolation regions surrounds an isolated active region and wherein the reset element, select element and drive element are formed at different isolated active regions at corner portions of the photoelectric conversion elements.

56. The system of claim 42 wherein at least one of the dielectric isolation regions surrounds an isolated active region and wherein two of the select element, drive element, and reset element are formed at a common first isolated active region, and wherein the other of the select element, drive element, and reset element is formed at a second isolated active region that is separated from the first isolated active region, the first and second isolated active regions being positioned at corner portions of corresponding photoelectric conversion elements.

57. The system of claim 42 wherein the four neighboring photoelectric elements share a common photoelectric active region.

58. A method of forming an image sensor comprising:
providing an array of photoelectric conversion elements in a substrate, the photoelectric conversion elements being arranged in rows and columns extending in a first direction and a second direction respectively;
providing a plurality of first junction isolation regions in the substrate that each isolate side portions of neighboring photoelectric conversion elements of a common row, and a plurality of second junction isolation regions in the substrate that each isolate side portions of neighboring photoelectric conversion elements of a common column, wherein the junction isolation regions comprise regions of the substrate that are doped with impurities; and
providing a plurality of dielectric isolation regions in the substrate, that each isolate corner portions of neighboring photoelectric conversion elements, wherein the dielectric isolation regions comprise portions of a dielectric insulation material that are provided in the substrate.

59. The method of claim 58 wherein the photoelectric conversion elements have a first pitch in the first direction and have a second pitch in the second direction and wherein the first pitch is substantially equal for the photoelectric conversion elements of a common row, and wherein the second pitch is substantially equal for the photoelectric conversion elements of a common column.

60. The method of claim 58, wherein each photoelectric conversion element abuts at least one of the plurality of first junction isolation regions, at least one of the plurality of second junction isolation regions, and at least one of the plurality of dielectric isolation regions.

61. The method of claim 58, wherein at least one of the plurality of dielectric isolation regions abuts at least one of the plurality of first junction isolation regions and at least one of the plurality of second junction isolation regions.

62. The method of claim 58, wherein the dielectric isolation regions are positioned in trenches formed in the substrate.

63. The method of claim 59 further comprising forming an array of microlenses over the photoelectric conversion elements, the microlenses being arranged in rows and columns, each microlens having a focal point that is aligned with a corresponding photoelectric conversion element, wherein the focal points of the microlenses are arranged to have a first pitch in the first direction and a second pitch in the second direction that are substantially equal to the first pitch of the photoelectric conversion elements, respectively.

64. The method of claim 59 wherein the first pitch is equal to the second pitch.

* * * * *

UNITED STATES PATENT AND TRADEMARK OFFICE
CERTIFICATE OF CORRECTION

PATENT NO.       : 7,667,183 B2                                    Page 1 of 1
APPLICATION NO.  : 11/593663
DATED            : February 23, 2010
INVENTOR(S)      : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 287 days.

Signed and Sealed this

Twenty-eighth Day of December, 2010

David J. Kappos
*Director of the United States Patent and Trademark Office*